(12) United States Patent
Kim et al.

(10) Patent No.: US 9,178,135 B2
(45) Date of Patent: Nov. 3, 2015

(54) MAGNETIC DEVICE

(71) Applicants: Young-hyun Kim, Seoul (KR); Hee-ju Shin, Yongin-si (KR); Woo-jin Kim, Yongin-si (KR); Sang-hwan Park, Hwaseong-si (KR)

(72) Inventors: Young-hyun Kim, Seoul (KR); Hee-ju Shin, Yongin-si (KR); Woo-jin Kim, Yongin-si (KR); Sang-hwan Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/254,858

(22) Filed: Apr. 16, 2014

(65) Prior Publication Data

US 2014/0327095 A1   Nov. 6, 2014

(30) Foreign Application Priority Data

May 3, 2013   (KR) .................. 10-2013-0050102

(51) Int. Cl.
*H01L 43/02* (2006.01)
*H01L 43/10* (2006.01)
*H01L 43/08* (2006.01)
*H01L 43/12* (2006.01)
*H01L 27/22* (2006.01)

(52) U.S. Cl.
CPC .............. *H01L 43/10* (2013.01); *H01L 43/08* (2013.01); *H01L 27/228* (2013.01); *H01L 43/12* (2013.01)

(58) Field of Classification Search
CPC ......... H01L 43/10; H01L 43/08; H01L 43/12; H01L 27/228
See application file for complete search history.

(56) References Cited

U.S. PATENT DOCUMENTS

| 7,572,646 | B2 | 8/2009 | Guo |
| 7,973,349 | B2 | 7/2011 | Huai et al. |
| 2008/0124582 | A1 | 5/2008 | Kim et al. |
| 2008/0203505 | A1 | 8/2008 | Guo |
| 2011/0031569 | A1 | 2/2011 | Watts et al. |
| 2011/0140217 | A1 | 6/2011 | Nguyen et al. |
| 2012/0043631 | A1 | 2/2012 | Ohmori et al. |
| 2012/0280337 | A1 | 11/2012 | Cao et al. |
| 2013/0028013 | A1 | 1/2013 | Ikeda et al. |
| 2013/0334629 | A1* | 12/2013 | Kula et al. ............. 257/421 |

FOREIGN PATENT DOCUMENTS

| JP | 2011155073 A | 8/2011 |
| JP | 2012174708 A | 9/2012 |

OTHER PUBLICATIONS

Yakushiji, K. et al., "Reduced magnetization in CoPtV and CoNiPt synthetic alloy thin films for STT-MRAM application," 2:54, 12th Joint MMM-Intermag Conference (Abstracts), Jan. 12-18, 2013, IEEE Magnetics, AIP / American Institute of Physics, Chicago, IL, p. 602.

* cited by examiner

*Primary Examiner* — Long Pham
(74) *Attorney, Agent, or Firm* — Renaissance IP Law Group LLP

(57) ABSTRACT

A magnetic device can include a tunnel barrier and a hybrid magnetization layer disposed adjacent the tunnel barrier. The hybrid magnetization layer can include a first perpendicular magnetic anisotropy (PMA) layer, a second PMA layer, and an amorphous blocking layer disposed between the first and second PMA layers. The first PMA layer can include a multi-layer film in which a first layer formed of Co and a second layer formed of Pt or Pd are alternately stacked. A first dopant formed of an element different from those of the first and second layers can also be included in the first PMA layer. The second PMA layer can be disposed between the first PMA layer and the tunnel barrier, and can include at least one element selected from a group consisting of Co, Fe, and Ni.

19 Claims, 17 Drawing Sheets

MAGNETIC DEVICE

CROSS-REFERENCE TO RELATED APPLICATIONS

This application claims the benefit of Korean Patent Application No. 10-2013-0050102, filed on May 3, 2013, in the Korean Intellectual Property Office, the disclosure of which is incorporated herein in its entirety by reference.

BACKGROUND

The inventive concepts disclosed herein relate to magnetic devices, and more particularly, to a magnetic device with a magnetic layer having perpendicular magnetic anisotropy (PMA).

Research has been actively conducted into magnetic devices which utilize the magnetic resistance characteristics of a magnetic tunnel junction (MTJ). In particular, as MTJ cells of a highly-integrated magnetic random access memory (MRAM) device become finer, attention has been given to a spin transfer torque (STT)-MRAM that stores information based on STT, which is a physical phenomenon, by directly supplying current to the MTJ cells to cause magnetization reversal. It is important for a highly-integrated STT-MRAM to perform fast switching and low-current operations and to secure sufficient perpendicular magnetic anisotropy in a magnetic layer having an MTJ structure.

SUMMARY

The inventive concepts provide a magnetic device that has high heat-resistant characteristics to stably maintain perpendicular magnetic anisotropy (PMA) at high temperatures. The inventive concepts further provide a magnetic device that is capable of performing low-current operations and securing a high tunneling magneto-resistance (TMR) ratio.

According to an aspect of the inventive concepts, a magnetic device includes a tunnel barrier and a hybrid magnetization layer disposed at a side of the tunnel barrier. The hybrid magnetization layer can include a first PMA layer, a second PMA layer, and an amorphous blocking layer disposed between the first PMA layer and the second PMA layer. The first PMA layer can include a multi-layer film (in which a first layer formed of Co and a second layer formed of Pt or Pd are alternately stacked), and a first dopant formed of an element different from elements of the first and second layers. The second PMA layer can be disposed between the first PMA layer and the tunnel barrier and may include at least one element selected from Co, Fe, and Ni.

In some embodiments, the first PMA layer may include at least one of a first stacked structure expressed as [CoX/Pt]×m and a second stacked structure expressed as [Co/PtX]×n. Here, 'X' denotes the first dopant, 'm' denotes a number of times in which the stacking of the first stacked structure is repeated (e.g., where $2 \le m \le 20$), and 'n' denotes a number of times in which the stacking of the second stacked structure is repeated (e.g., where $2 \le n \le 20$).

In some embodiments, the first PMA layer may include at least one of a first stacked structure expressed as [CoX/Pd]×m, and a second stacked structure expressed as [Co/PdX]×n. Here, 'X' denotes the first dopant, 'm' denotes a number of times in which the stacking of the first stacked structure is repeated (e.g., where $2 \le m \le 20$), and 'n' denotes a number of times in which the stacking of the second stacked structure is repeated (e.g., where $2 \le n \le 20$).

The first dopant may include at least one element selected from Ni, Fe, V, Cr, and Si.

The second PMA layer may include a material expressed as $Co_aFe_bB_cZ_{(1-a-b-c)}$, wherein 'Z' denotes a second dopant, and where a, b, and c each denote an atomic ratio (e.g., where $0 \le a \le 0.9$, $0 \le b \le 0.9$, and $0 \le c \le 0.4$, and wherein a, b, and c are not all '0'). The second dopant may include at least one element selected from a group including Si, Cr, Al, Ta, Hf, Zr, Ni, V, Mo, P, C, W, Nb, Mn, and Ge.

The first PMA layer and the second PMA layer may have different crystal-oriented structures. For example, in some embodiments, the first PMA layer may have a hexagonal closest packing (HCP) (001) crystal-oriented structure, and the second PMA layer may have a body-centered cubic (BCC) (001) crystal-oriented structure.

In some embodiments, the first PMA layer may include a magnetic material having an $L1_1$ type or $L1_0$ type atomic ordering structure.

The blocking layer may include at least one material selected from a group including metals, alloys, metal oxides, metal nitrides, and metal oxynitrides.

According to another aspect of the inventive concepts, a magnetic device can include a free layer including a first magnetization layer; a pinned layer including a second magnetization layer; and a tunnel barrier disposed between the free layer and the pinned layer. At least one of the first and second magnetization layers can include a hybrid magnetization layer including a first PMA layer, a second PMA layer, and an amorphous blocking layer disposed between the first PMA layer and the second PMA layer. The first PMA layer can include a multi-layer film (in which a first layer formed of Co and a second layer formed of Pt or Pd are alternately stacked), and a first dopant formed of an element that is different from elements of the first layer and the second layer. The second PMA layer can be disposed between the first PMA layer and the tunnel barrier, and may include at least one element selected from a group including Co, Fe, and Ni.

The first PMA layer may have an axis of easy magnetization in a direction perpendicular to a direction in which the first PMA layer extends, and may include a magnetic material having a Co-based $L1_1$ type or $L1_0$ type atomic ordering structure. The first dopant may include at least one element selected from a group including Ni, Fe, V, Cr, and Si.

The second PMA layer may have an axis of easy magnetization in a direction perpendicular to a direction in which the second PMA layer extends, and may include a single-layer film or a multi-layer film formed of a material expressed as $Co_aFe_bB_cZ_{(1-a-b-c)}$. Here, Z denotes a second dopant, and a, b, and c each denote an atomic ratio (e.g., where $0 \le a \le 0.9$, $0 \le b \le 0.9$, and $0 \le c \le 0.4$, and wherein a, b, and c are not all '0'). The second dopant may include an element selected from a group including Si, Cr, Al, Ta, Hf, Zr, Ni, V, Mo, P, C, W, Nb, Mn, and Ge.

The second PMA layer may further include a non-magnetic material layer.

In some embodiments, the first magnetization layer may include the hybrid magnetization layer, and the second magnetization layer may have a synthetic anti-ferromagnetic coupling (SAF) coupling structure.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
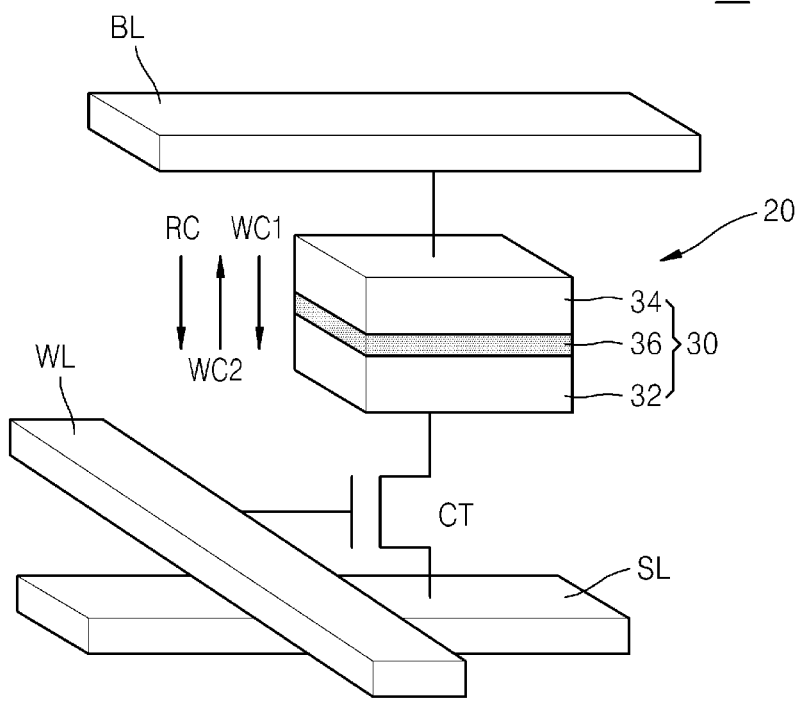
FIG. 1 is a schematic diagram of a magnetic device according to an embodiment of the inventive concepts.

Hereinafter, exemplary embodiments of the inventive concepts will be described in greater detail with reference to the accompanying drawings. The same elements are assigned the same reference numerals throughout the drawings and redundant descriptions thereof are omitted.

These embodiments may, however, be embodied in many different forms and should not be construed as being limited to these embodiments. Rather, these embodiments are provided so that this disclosure will be thorough and complete and will fully convey the inventive concepts to those of ordinary skill in the art.

In the drawings, the thicknesses of layers and regions may be exaggerated for clarity.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

When an embodiment of the inventive concepts may be accomplished in a different way, a specific operation may be performed in an order that is different from the order described in the present disclosure. For example, two operations that are described herein as being sequentially performed may be performed substantially simultaneously or may be performed in a reverse order.

In the accompanying drawings, variations from the shapes of the illustrations as a result, for example, of manufacturing techniques and/or tolerances, are to be expected. Thus, embodiments of the inventive concepts should not be construed as limited to the particular shapes of regions illustrated herein, but include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic exploded perspective illustration of a magnetic device 10 according to an embodiment of the inventive concepts. More specifically, FIG. 1 illustrates a memory cell 20 of the magnetic device 10 including a spin transfer torque (STT)-magnetic random access memory (MRAM).

Referring to FIG. 1, the memory cell 20 may include a magnetic tunnel junction (MTJ) structure 30 and a cell transistor CT. In the cell transistor CT, a gate is connected to a word line WL, one electrode is connected to a bit line BL via the MTJ structure 30, and another electrode is connected to a source line SL.

The MTJ structure 30 can include a free layer 32, a pinned layer 34, and a tunnel barrier 36 interposed between the free layer 32 and the pinned layer 34. The free layer 32 can have an axis of easy magnetization in a direction perpendicular to a direction in which the free layer 32 extends, and has a magnetization direction that varies according to conditions. The pinned layer 34 can have an axis of easy magnetization in a direction perpendicular to a direction in which the pinned layer 34 extends and has a fixed magnetization direction.

A resistance value of the MTJ structure 30 varies according to a magnetization direction of the free layer 32. When a magnetization direction in the free layer 32 and a magnetization direction in the pinned layer 34 are parallel to each other, the MTJ structure 30 may have a low resistance value corresponding to a stored data value '0'. When the magnetization direction in the free layer 32 and the magnetization direction in the pinned layer 34 are antiparallel to each other, the MTJ structure 30 may have a high resistance value corresponding to a stored data value '1'.

At least one of the free layer 32 and the pinned layer 34 can include a hybrid magnetization layer 50 according to an embodiment of the inventive concepts, which will be described with reference to FIG. 2 below.

In FIG. 1, the locations of the free layer 32 and the pinned layer 34 are not limited to the relative positions shown, and their locations may be switched relative to each other.

In the magnetic device 10 of FIG. 1, for a write operation of the STT-MRAM, the cell transistor CT is turned on by applying a logic 'high' voltage to a word line WL and write currents WC1 and WC2 are supplied between the bit line BL and the source line SL. The magnetization direction of the free layer 32 may be determined by a direction in which the write currents WC1 and WC2 are supplied. In the MTJ structure 30, the magnetization direction of the free layer 32 may be changed using spin transfer torque (STT).

In the magnetic device 10 of FIG. 1, for a read operation of the STT-MRAM, the cell transistor CT is turned on by applying the logic 'high' voltage to the word line WL, and data stored in the MTJ structure 30 may be determined by evaluating the resistance value of the MTJ structure 30 while supplying a read current RC in a direction from the bit line BL to the source line SL. In this case, since the intensity of the read current is lower than those of the write currents WC1 and WC2, the magnetization direction of the free layer 34 is not changed by the read current.

Figure 2:
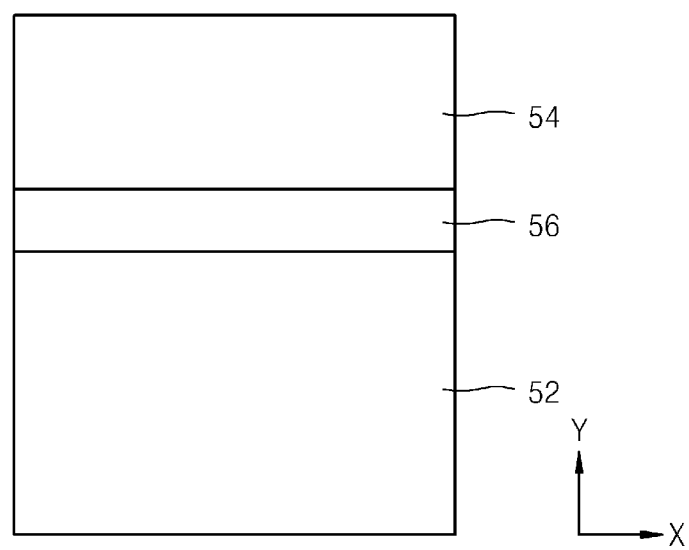
FIG. 2 is a schematic cross-sectional view of a hybrid magnetization layer included in a magnetic device according to an embodiment of the inventive concepts.

FIG. 2 is a schematic cross-sectional view of the hybrid magnetization layer 50 that can be included in the MTJ structure 30 of FIG. 1 and FIGS. 3A to 3D are schematic cross-sectional views illustrating various possible structures of first PMA layer 52A, 52B, 52C, and 52D that may be employed as the first PMA layer 52 of the hybrid magnetization layer 50 of FIG. 2, according to embodiments of the inventive concepts. The hybrid magnetization layer 50 may form the free layer 32 and/or the pinned layer 34 included in the MTJ structure 30 illustrated in FIG. 1.

Referring to FIG. 2, the hybrid magnetization layer 50 can include a first perpendicular magnetic anisotropy (PMA) layer 52, a second PMA layer 54, and a blocking layer 56 interposed between the first PMA layer 52 and the second PMA layer 54.

As further illustrated in FIGS. 3A to 3D, the first PMA layer 52 can include a multi-layer film formed by alternately stacking a first layer (formed of cobalt (Co)) and a second layer (formed of platinum (Pt) or palladium (Pd)). The first PMA layer 52 can further include a first dopant formed of an element X that is different from the elements of the first layer and the second layer.

The first PMA layer 52 can have an axis of easy magnetization arranged in a direction (a Y-axis direction in FIG. 2) perpendicular to a direction (an X-axis direction) in which the first PMA layer 52 extends. In some embodiments, the first PMA layer 52 may include a magnetic material having a cobalt (Co)-based $L1_1$ type or $L1_0$ type atomic ordering structure. Here, '$L1_1$' and '$L1_0$' are named according to the strukturbericht designation.

The first PMA layer 52 may have a thickness of about 10 to 200 Å, but is not limited thereto.

Figure 3A:
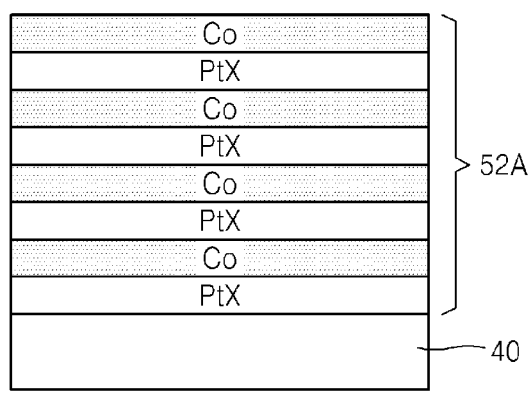
FIGS. 3A to 3D are schematic cross-sectional views illustrating structures of various examples of a first perpendicular magnetic anisotropy (PMA) layer that may be employed in a hybrid magnetization layer included in a magnetic device according to embodiments of the inventive concepts.
Figure 3B:
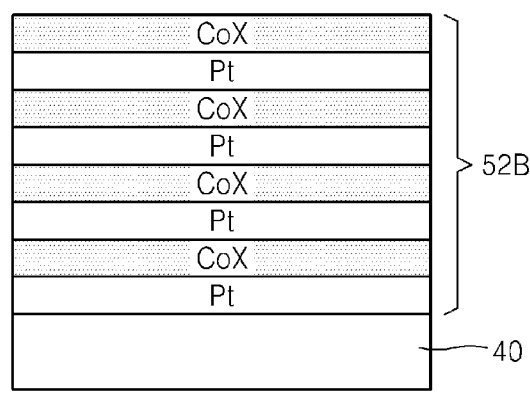

In some embodiments, such as those illustrated in FIGS. 3A and 3B, the first PMA layer 52 may have at least one of a first stacked structure expressed as [CoX/Pt]×m, and a second stacked structure expressed as [Co/PtX]×n. Here, 'X' denotes the first dopant, 'm' denotes a number of stacked [CoX/Pt] structures, for example, where 2≤m≤20, and 'n' denotes a number of stacked [Co/PtX] structures, for example, where 2≤n≤20.

Figure 3C:
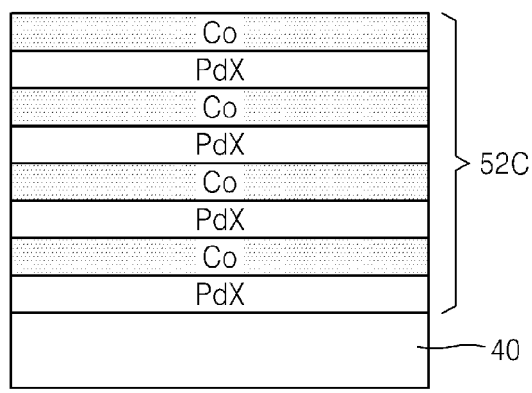
Figure 3D:
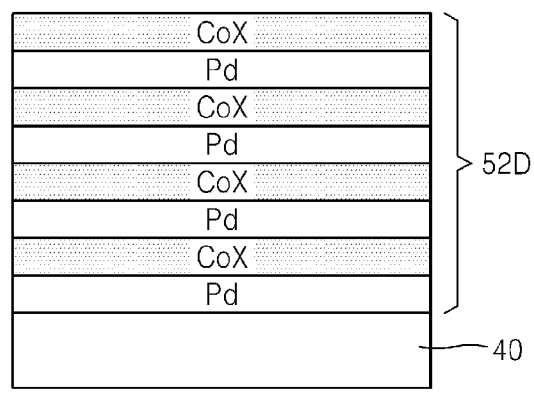

In some embodiments, such as those illustrated in FIGS. 3C and 3D, the first PMA layer 54 may have at least one of a first stacked structure expressed as [CoX/Pd]×m, and a second stacked structure expressed as [Co/PdX]×n. Here, 'X' denotes the first dopant, 'm' denotes a number of stacked [CoX/Pd] structures, for example, where 2≤m≤20, and 'n' denotes a number of stacked [Co/PdX] structures, for example, where 2≤n≤20.

The first dopant X included in the first PMA layer 52 may be formed of at least one element selected from the group including nickel (Ni), iron (Fe), vanadium (V), chromium (Cr), and silicon (Si). In some embodiments, the first dopant X may be doped in the first PMA layer 52 at a doping concentration of about 5 to 50 at/%, but the inventive concepts are not limited thereto.

Referring now specifically to FIG. 3A, a PtX layer and a Co layer can be alternately formed on a seed layer 40 a desired number of times to form the first PMA layer 52A. Here, the PtX layer is a Pt layer doped with first impurities X.

In some embodiments, the seed layer 40 may have a HCP crystal structure. In some embodiments, the seed layer 40 may be formed of Ru, Pt, and/or Pd.

Although FIG. 3A illustrates a case in which the PtX layer is first formed on the seed layer 40 and a Co layer is formed on the PtX layer, the inventive concepts are not limited thereto. The PtX layer may be formed on the Co layer after the Co layer is formed on the seed layer 40. In the first PMA layer 52A, the PtX layer and the Co layer may be each formed to a thickness of about 1 to 5 Å.

Referring now to FIG. 3B, a Pt layer and a CoX layer can be alternately formed on a seed layer 40 a number of times to form the first PMA layer 52B. Here, the CoX layer is a Co layer doped with first impurities X.

Although FIG. 3B illustrates a case in which the Pt layer is first formed on the seed layer 40 and the CoX layer is formed on the Pt layer, the inventive concepts are not limited thereto. The Pt layer may be formed on the CoX layer after the CoX layer is formed on the seed layer 40. In the first PMA layer 52B, the Pt layer and the CoX layer may be each formed to a thickness of about 1 to 5 Å.

Referring to FIG. 3C, a PdX layer and a Co layer can be alternately formed on a seed layer 40 a number of times to form the first PMA layer 52C. Here, the PdX layer is a Pd layer doped with first impurities X.

Although FIG. 3C illustrates a case in which the PdX layer is first formed on the seed layer 40 and the Co layer is formed on the PdX layer, the inventive concepts are not limited thereto. The PdX layer may be formed on the Co layer after the Co layer is formed on the seed layer 40. In the first PMA layer 52C, the PdX layer and the Co layer may be each formed to a thickness of about 1 to 5 Å.

Referring to FIG. 3D, a Pt layer and a CoX layer can be alternately formed on a seed layer 40 a number of times to form the first PMA layer 52D. Here, the CoX layer is a Co layer doped with first impurities X.

Although FIG. 3D illustrates a case in which the Pd layer is first formed on the seed layer 40 and the CoX layer is formed on the Pd layer, the inventive concepts are not limited thereto. The Pd layer may be formed on the CoX layer after the CoX layer is formed on the seed layer 40. In the first PMA layer 52D, the Pt layer and the CoX layer may be each formed to a thickness of about 1 to 5 Å.

FIGS. 3A to 3D illustrate the first PMA layers 52A and 52B including a Co/Pt stacked structure doped with the first dopant X and formed on the seed layer 40 according to different methods, and the first PMA layers 52C and 52D including a Co/Pd stacked structure doped with the first dopant X and formed on the seed layer 40 according to different methods. However, the first PMA layer 52 of the hybrid magnetization layer 50 illustrated in FIG. 2 is not limited to the first PMA layers 52A to 52D illustrated in FIGS. 3A to 3D, and may be modified without departing from the scope of the inventive concepts.

As illustrated in FIGS. 2 and 3A to 3D, a first PMA layer 52 having any of various structures may be formed by doping first impurities X formed of magnetic or non-magnetic materials onto a PMA material having high heat resistance, thereby lowering a saturation magnetization value Ms and enabling low-current operations to be performed. In some embodiments, the first PMA layer 52 may provide a low saturation magnetization value Ms of about 700 emu/cc or less.

The second PMA layer 54 can include a first element selected from Co, Fe, and Ni, and a second dopant formed of an element which is different from the first element.

The second PMA layer 54 can have an axis of easy magnetization arranged in a direction (the Y-axis direction) perpendicular to a direction (the X-axis direction) in which the second PMA layer 54 extends. In some embodiments, the second PMA layer 54 may include a single-layer film or a multi-layer film formed of a material expressed as $Co_aFe_b$-$B_cZ_{(1-a-b-c)}$. Here, 'Z' denotes the second dopant, and 'a', 'b', and 'c' each denote an atomic ratio (where, for example, $0 \le a \le 0.9$, $0 \le b \le 0.9$, $0 \le c \le 0.4$, and wherein 'a', 'b', and 'c' are not all '0'). In the second PMA layer 54, the second dopant Z is optional.

The second PMA layer 54 may have a thickness of about 10 to 100 Å, but is not limited thereto.

The second dopant Z, optionally included in the second PMA layer 54, may be formed of at least one element selected from the group consisting of Si, Cr, Al, Ta, Hf, Zr, Ni, V, Mo, P, C, W, Nb, Mn, and Ge. The second dopant Z may be doped into the second PMA layer 54 at a doping concentration of about 0 to 50 at %, but the inventive concepts are not limited thereto. In some embodiments, when the second dopant Z is included in the second PMA layer 54, the second dopant Z may control a lattice constant of an alloy that constitutes the second PMA layer 54.

In some embodiments, the second PMA layer 54 may be a single-layer film formed of Fe, Co, Ni, CoFe, NiFe, NiFeB, CoFeB, CoFeBTa, CoHf, CoZr, CoFeSi, CoFeP, CoFeW, or CoFeNb, or a multi-layer film formed of at least two materials selected from the group consisting of Fe, Co, Ni, CoFe, NiFe, NiFeB, CoFeB, CoFeBTa, CoHf, CoZr, CoFeSi, CoFeP, CoFeW, and CoFeNb. For example, the second PMA layer 54 may have a Fe/CoHf/CoFeB stacked structure.

In some embodiments, the second PMA layer 54 may be formed of a combination of a ferromagnetic material layer and a non-magnetic material layer. The non-magnetic material layer may be formed in a structure interposed between ferromagnetic material layers. For example, the second PMA layer 54 may have a CoFeB/Ta/CoFeB stacked structure. In the second PMA layer 54, the non-magnetic material layer disposed between ferromagnetic material layers may have a thickness of about 2 to 20 Å.

By including the second PMA layer 54 in the hybrid magnetization layer 50, the hybrid magnetization layer 50 may enable a high TMR ratio.

In the hybrid magnetization layer 50, the first PMA layer 52 and the second PMA layer 54 may have differently-oriented crystalline structures. In some embodiments, the first PMA layer 52 may have a hexagonal closest packing (HCP) (001) crystal-oriented structure, and the second PMA layer 54 may have a body-centered cubic (BCC) (001) crystal-oriented structure. In some embodiments, the first PMA layer 52 may be formed of a magnetic material having an $L1_1/L1_0$-type atomic ordering structure.

The first PMA layer 52 having the HCP (001) crystal-oriented structure may include a ferromagnetic alloy including CoPd, CoPt, NiCo, NiPt, or the like. The ferromagnetic alloy may be doped with a first dopant X to form the first PMA layer 52.

A representative example of a material having the BCC (001) crystal-oriented structure among materials that may constitute the second PMA layer 54 is a CoFe alloy. A crystal structure of the CoFe alloy may vary according to a composition ratio thereof. In some embodiments, the amount of Co contained in the CoFe alloy may be about 75 at % or less to achieve a stable BSS structure in the second PMA layer 54. In some embodiments, a tunnel barrier of a magnetic device, e.g., the tunnel barrier 36 of FIG. 1, may be directly formed on the second PMA layer 54. For example, when a tunnel barrier formed of MgO is grown on a CoFe film that constitutes the second PMA layer 54, a (001)-oriented MgO film may be formed in the direction (the Y-axis direction) perpendicular to the direction in which the second PMA layer 54 extends.

In some embodiments, at least one dopant selected from the group including Ni, B, C, P, Mo, Si, W, Nb, Mn, and Ge may be added to the CoFe alloy to control a lattice constant of the CoFe alloy that constitutes the second PMA layer 54.

In the hybrid magnetization layer 50, the blocking layer 56 interposed between the first PMA layer 52 and the second PMA layer 54 may be formed of an amorphous film. In some embodiments, the blocking layer 56 may be formed of a film that is thin enough to have amorphous characteristics. In some embodiments, the blocking layer 56 may have a thickness of about 1 to 10 Å, but the inventive concepts are not limited thereto. In some embodiments, the blocking layer 56 may be formed of at least one material selected from metals, alloys, metal oxides, metal nitrides, and metal oxynitrides.

The blocking layer 56 may prevent a crystalline effect from occurring between the first PMA layer 52 and the second PMA layer 54. Also, the blocking layer 56 may strengthen the PMA of the second PMA layer 54 formed thereon. Also, the blocking layer 56 may act as an anti-diffusion layer between the first PMA layer 52 and the second PMA layer 54.

In some embodiments, the blocking layer 56 may be formed of Ta, Ru, Pd, Ti, Hf, Zr, Mg, Cr, W, Mo, Nb, Si, Y, MgO, RuO, CFBTa, a combination thereof, an alloy thereof, an oxide including these elements, a nitride including these elements, or an oxynitride including these elements.

The hybrid magnetization layer 50 of FIG. 2 may, for example, form either or both of a free layer and a pinned layer in an MTJ structure forming a magnetic device. The arrangement of the first PMA layer 52 and the second PMA layer 54 is not limited to that illustrated in FIG. 2. For example, the locations of the first PMA layer 52 and the second PMA layer 54 (having the blocking layer 56 therebetween) may be switched without departing from the scope of the inventive concepts.

Figure 4:
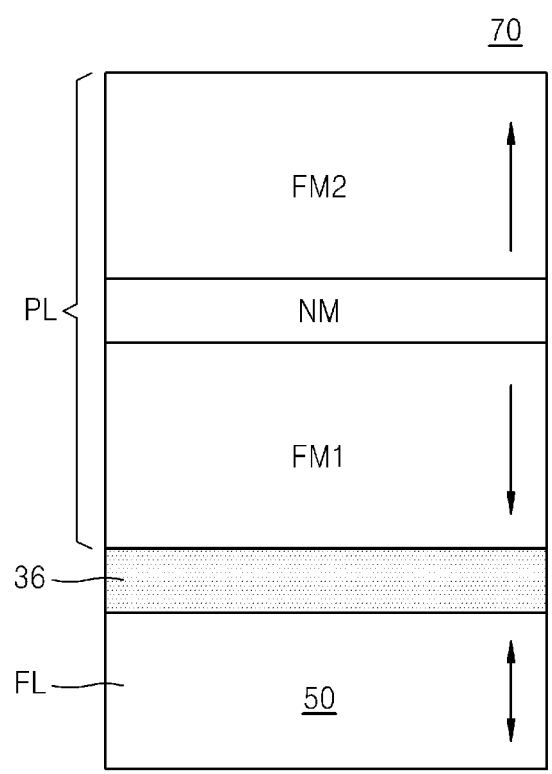
FIG. 4 is a schematic cross-sectional view of a magnetic tunnel junction (MTJ) structure of a magnetic device according to an embodiment of the inventive concepts.

FIG. 4 is a schematic cross-sectional view of an MTJ structure 70 of a magnetic device according to an embodiment of the inventive concepts. The MTJ structure 70 may be used in place of the MTJ structure 30 in the memory cell 20 of the magnetic device 10 illustrated in FIG. 1. In FIG. 4, the same reference numerals as used in FIGS. 1 and 2 denote the same elements and are not described again here.

Referring to FIG. 4, the MTJ structure 70 can include a free layer FL including a hybrid magnetization layer 50 as shown in FIG. 2, a pinned layer PL having a synthetic anti-ferromagnets (SAF) structure, and a tunnel barrier 36 interposed between the free layer FL and the pinned layer PL.

The pinned layer PL can include two ferromagnetic layers FM1 and FM2 that are separated from each other by a thin non-magnetic layer NM. Using this structure, an anti-ferromagnetic coupling occurs in the SAF structure due to a Ruderman-Kittel-Kasuya-Yosida (RKKY) interaction caused by the thin non-magnetic layer NM inserted between the two ferromagnetic layers FM1 and FM2. Magnetic domains of each of the ferromagnetic layers are arranged in different directions due to anti-ferromagnetic coupling occurring interactively in the two ferromagnetic layers FM1 and FM2, thereby minimizing a total amount of magnetization in the SAF structure of the pinned layer PL.

When a magnetic field applied to the free layer FL from the outside reaches a reversed switching field that is a magnetization reversal threshold, an electrical resistance value of the MTJ structure 70 may instantaneously change due to magnetization reversal of the free layer FL.

In some embodiments, the two ferromagnetic layers FM1 and FM2 may each be formed of a material such as CoFeB, CoFe, NiFe, FePt, CoPt, etc. The thin non-magnetic layer NM may include at least one material selected from the group consisting of Ru, Cr, Pt, Pd, Ir, Rh, Ru, Os, Re, Au, and Cu.

Figure 5:
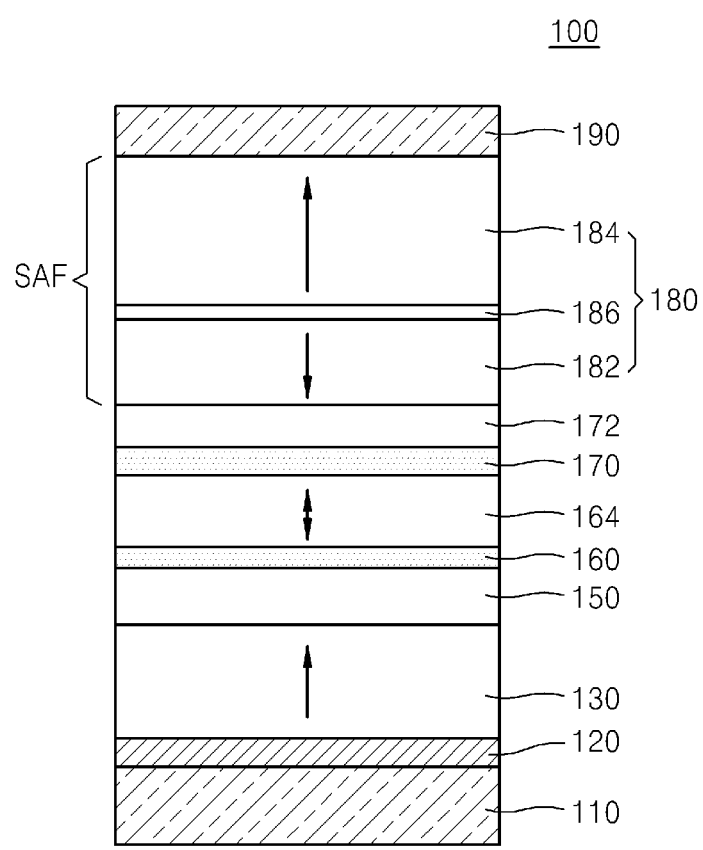
FIG. 5 is a schematic cross-sectional view of a magnetic device according to an embodiment of the inventive concepts.

FIG. 5 is a schematic cross-sectional view of a magnetic device 100 according to an embodiment of the inventive concepts. Referring to FIG. 5, the magnetic device 100 can include an electrode 110, a seed layer 120 formed on the electrode 110, and a lower pinned layer 130 formed on the seed layer 120.

The electrode 110 may be formed of a metal or a metal nitride. For example, the electrode 110 may be formed of TiN. In some embodiments, the electrode 110 may be formed of a TiN film having a relatively low content of N to realize a low wire resistance. For example, the electrode 110 may be formed of a TiN film in which an atomic ratio of N is lower than that of Ti.

The seed layer 120 may, for example, be formed of Ru, Pt, or Pd.

In some embodiments, a buffer layer (not shown) may be interposed between the electrode 110 and the seed layer 120. The buffer layer may match a crystal structure of the electrode 110 and a crystal structure of the seed layer 120. For example, the buffer layer may be formed of Ta.

The lower pinned layer 130 may provide stable switching characteristics by compensating for a leaking magnetic field in an upper pinned layer 180 having an SAF structure. The lower pinned layer 130 can have an axis of easy magnetization in a direction perpendicular to an interface surface between the lower pinned layer 130 and the seed layer 120. In the lower pinned layer 130, a magnetization direction does not change.

Although FIG. 5 illustrates a magnetization direction of the lower pinned layer 130 that is opposite a direction of the electrode 110, i.e., a direction toward the upper pinned layer 180, the inventive concepts are not limited thereto. The magnetization direction of the lower pinned layer 130 may instead be directed toward the electrode 110.

In some embodiments, the lower pinned layer 130 may include a Co-based vertical pinned layer. For example, the lower pinned layer 130 may have a [Co/Pt]×n stacked structure in which a Co film having a thickness of about 1 to 5 Å. and a Pt film having a thickness of about 1 to 5 Å. are alternately stacked several times. In some embodiments, the lower pinned layer 130 may have a [Co/Pd]×n stacked structure in which a Co film having a thickness of about 1 to 5 Å. and a Pd film having a thickness of about 1 to 5 Å. are alternately stacked several times. Here, 'n' denotes a number of times the Co and Pt or Pd layers are stacked.

The lower pinned layer 130 may be formed using an ultra-thin film epitaxial growth process using a solid phase epitaxial growth. For example, the lower pinned layer 130 may be formed by molecular beam epitaxy (MBE) or metal organic chemical vapor deposition (MOCVD). The lower pinned layer 130 may be formed at a relatively low process temperature, e.g., about 200 to 400° C. For example, the lower pinned layer 130 may be formed at about 300° C. The lower pinned layer 130 may have a thickness of about 20 to 30 Å.

A first polarization-enhancement layer 150 can be formed on the lower pinned layer 130 to increase spin polarization in the lower pinned layer 130. The first polarization-enhancement layer 150 may be formed of a CoFeB magnetic layer. A magnetization direction of the first polarization-enhancement layer 150 may be the same as the magnetization direction of the lower pinned layer 130. The first polarization-enhancement layer 150 may have a thickness of about 10 to 20 Å. The first polarization-enhancement layer 150 is optional, however, and need not be included in every embodiment.

A first tunnel barrier 160 can be formed on the first polarization-enhancement layer 150, and a free layer 164, the magnetization direction of which is variable, can be formed on the first tunnel barrier 160. The free layer 164 may include a hybrid magnetization layer 50, such as that described with reference to FIGS. 2 and 3A to 3D.

A second tunnel barrier 170 can be formed on the free layer 164, and an upper pinned layer 180 can be formed on the second tunnel barrier 170.

The first tunnel barrier 160 and the second tunnel barrier 170 may each contain a non-magnetic material. In some embodiments, the first tunnel barrier 160 and the second tunnel barrier 170 may be each formed of an oxide including at least one material selected from the group consisting of Mg, Ti, Al, MgZn, and MgB. In some embodiments, the first tunnel barrier 160 and the second tunnel bather 170 may each be formed of a Ti nitride or a vanadium (V) nitride. In some embodiments, at least one of the first tunnel barrier 160 and the second tunnel barrier 170 may be a single-layer film. In some embodiments, at least one of the first tunnel barrier 160 and the second tunnel barrier 170 may be a multi-layer film including a plurality of layers. For example, at least one of the first tunnel barrier 160 and the second tunnel barrier 170 may have a multi-layer structure such as Mg/MgO, MgO/Mg, or Mg/MgO/Mg. In some embodiments, the second tunnel barrier 170 may be thicker than the first tunnel barrier 160.

The magnetic device 100 of FIG. 5 provides a dual magnetic tunneling junction (MTJ) structure having a first tunnel barrier 160 and a second tunnel barrier 170. When current is supplied via this dual MTJ structure, switching may be performed between stable magnetic states in the free layer 164. By forming the magnetic device 100 having the dual MTJ structure, improved performance of a more highly-integrated magnetic memory device may be provided.

In some embodiments, however, the first tunnel barrier 160 is optional.

A second polarization-enhancement layer 172 can be interposed between the second tunnel barrier 170 and the upper pinned layer 180. The second polarization-enhancement layer 172 may include a ferromagnetic material selected from the group including Co, Fe, and Ni. The second polarization-enhancement layer 172 may have a high spin polarization ratio and a low damping constant. To this end, the second polarization-enhancement layer 172 may further include a non-magnetic material selected from the group including B, Zn, Ru, Ag, Au, Cu, C, and N. In some embodiments, the second polarization-enhancement layer 172 may be formed of a CoFeB magnetic layer. The second polarization-enhancement layer 172 may have a thickness of about 10 to 20

Å. The second polarization-enhancement layer 172 is optional, however, and need not be included in every embodiment.

The upper pinned layer 180 can include a first upper pinned layer 182, a second upper pinned layer 184, and an exchange coupling film 186 interposed between the first upper pinned layer 182 and the second upper pinned layer 184.

The first upper pinned layer 182 can have a magnetic moment that is antiparallel to the magnetic moment of the lower pinned layer 130. The second upper pinned layer 184 can have a magnetic moment that is antiparallel to that of the first upper pinned layer 182.

The upper pinned layer 180 may have an SAF structure such as that described above with respect to the vertical pinned layer PL illustrated in FIG. 4. For instance, the first upper pinned layer 182 and the second upper pinned layer 184 may correspond to the two ferromagnetic layers FM1 and FM2. The exchange coupling film 186 may correspond to the thin non-magnetic layer NM inserted between the two ferromagnetic layers FM1 and FM2.

The second polarization-enhancement layer 172 may increase spin polarization in the first upper pinned layer 182. A magnetic direction of the second polarization-enhancement layer 172 may be the same as the magnetization direction of the first upper pinned layer 182.

A capping layer 190 can be formed on the upper pinned layer 180. The capping layer 190 may include at least one material selected from the group consisting of Ru, Ta, Al, Cu, Au, Ag, Ti, TaN, and TiN.

In the magnetic device 100 of FIG. 5, a resistance value of the magnetic device 100 may vary according to a direction in which electrons flow via the dual MTJ structure. By using a variation in the resistance value, data may be stored in a memory cell including the magnetic device 100.

In the magnetic device 100 of FIG. 5, when the free layer 164 includes a hybrid magnetization layer 50 such as that described above with reference to FIGS. 2 and 3A to 3D, the first PMA layer 52 of the hybrid magnetization layer 50 provides the heat resistance required in the magnetic device 100 as well as a low saturation magnetization value Ms that allows performance of a low-current operation. Also, a high TMR ratio may be secured due to the second PMA layer 54 of the hybrid magnetization layer 50.

Although the free layer 164 has been described as including the hybrid magnetization layer 50 in the magnetic device 100 of FIG. 5, the inventive concepts are not limited thereto. In some embodiments, at least one among the lower pinned layer 130, the free layer 164, the first upper pinned layer 182, and the second upper pinned layer 184 may have a structure similar to the hybrid magnetization layer 50 described above with reference to FIGS. 2 and 3A to 3D. In some embodiments, the free layer 164 can include a hybrid magnetization layer 50, and at least one among the lower pinned layer 130, the first upper pinned layer 182, and the second upper pinned layer 184 can also include a hybrid magnetization layer 50.

In the magnetic device 100 of FIG. 5, when the first upper pinned layer 182 includes the hybrid magnetization layer 50 stacked structure as illustrated in FIG. 2, the second PMA layer 54 contacts, or is disposed adjacent to, the second tunnel barrier 170, and the first PMA layer 52 is disposed apart from the second tunnel barrier 170. Accordingly, the second PMA layer 54 may be formed first on the second tunnel barrier 170, and the blocking layer 56 and the first PMA layer 52 may then be sequentially formed on the second PMA layer 54.

Figure 6:
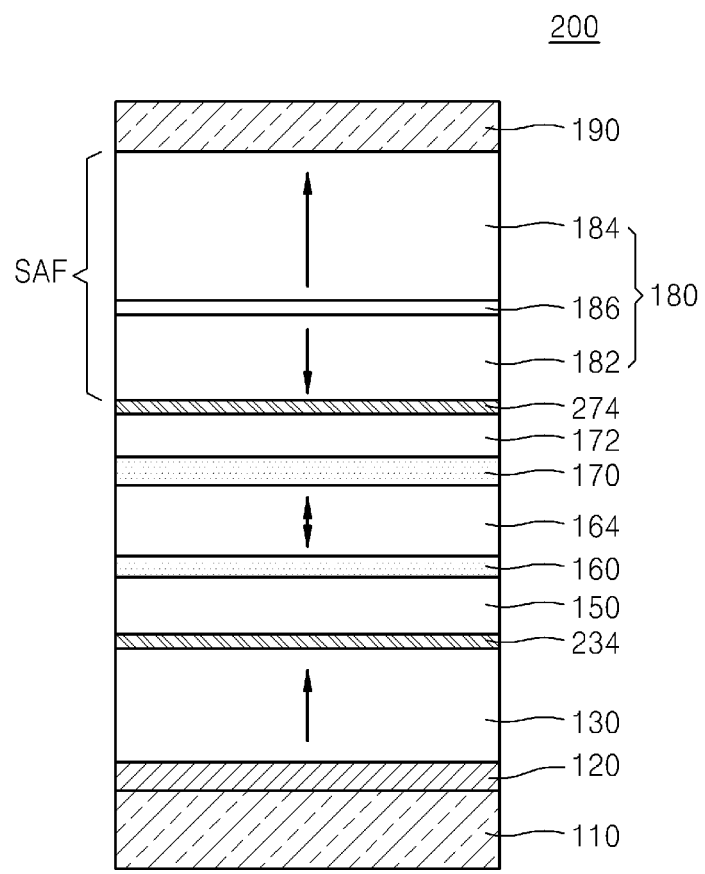
FIG. 6 is a schematic cross-sectional view of a magnetic device according to another embodiment of the inventive concepts.

FIG. 6 is a schematic cross-sectional view of a magnetic device 200 according to another embodiment of the inventive concepts. Referring to FIG. 6, the reference numerals that are the same as those in FIG. 5 denote the same elements and redundant description of those elements is therefore omitted.

The magnetic device 200 has substantially the same structure as the magnetic device 100 of FIG. 5. However, the magnetic device 200 further includes a first amorphous film 234 interposed between a lower pinned layer 130 and a first polarization-enhancement layer 150, and a second amorphous film 274 interposed between the second polarization-enhancement layer 172 and the first upper pinned layer 182.

In some embodiments, the first amorphous film 234 and the second amorphous film 274 may be each formed of Ta. In some embodiments, the first amorphous film 234 and the second amorphous film 274 may each have a thickness of about 1 to 6 Å, but the inventive concepts are not limited thereto.

Figure 7:
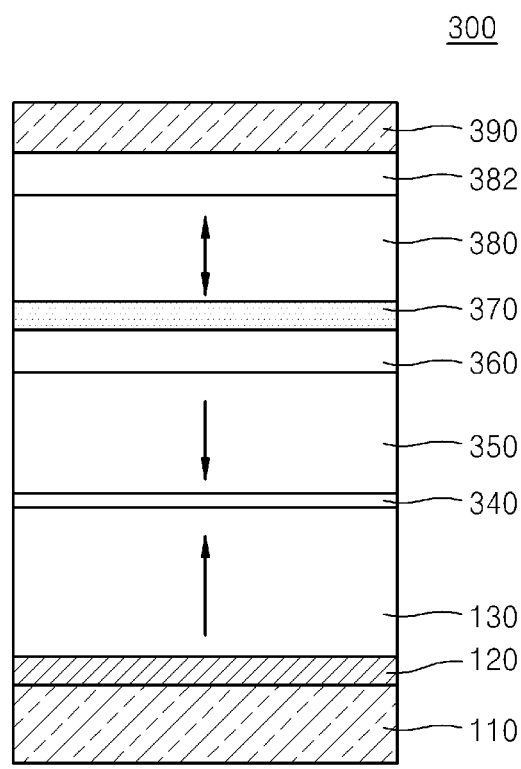
FIG. 7 is a schematic cross-sectional view of a magnetic device according to another embodiment of the inventive concepts.

FIG. 7 is a schematic cross-sectional view of a magnetic device 300 according to another embodiment of the inventive concepts. Reference numerals that are the same as those in FIG. 5 denote the same elements and redundant description of those elements is therefore omitted.

Referring to FIG. 7, the magnetic device 300 can include an electrode 110 and a seed layer 120 as described above with reference to FIG. 5. A lower pinned layer 130 having PMA, can be formed on the seed layer 120. An exchange coupling film 340 and an upper pinned layer 350 can be sequentially formed on the lower layer 130. The upper pinned layer 350 has a magnetic moment that is antiparallel to the lower pinned layer 130. The exchange coupling film 340 and the upper pinned layer 350 can be the same as the exchange coupling film 186 and the second upper pinned layer 184 described above with reference to FIG. 5.

A polarization-enhancement layer 360, a tunnel barrier 370, a free layer 380, a nano-oxide layer (NOL) 382, and a capping layer 390 can be sequentially formed on the upper pinned layer 350.

The polarization-enhancement layer 360 may be formed of a CoFeB magnetic layer. The tunnel barrier 370 may include a non-magnetic material. The tunnel barrier 370 can have substantially the same structure as the second tunnel barrier 170 described above with reference to FIG. 5. The free layer 380 may include a hybrid magnetization layer 50 as described above with reference to FIGS. 2 and 3A to 3D.

The NOL 382 may include a Ta oxide or an Mg oxide. In some embodiments, the NOL 382 is optional.

The capping layer 390 can be substantially the same as the capping layer 190 described above with reference to FIG. 5.

In the stacked structure of the magnetic device 300 of FIG. 7, since the free layer 380 includes the hybrid magnetization layer 50, heat resistance required in the magnetic device 300 may be provided to stably maintain PMA at relatively high temperatures, switching current may be lowered to enable performance of a low-current operation, and a high TMR ratio may be secured.

FIGS. 8A to 8K are somewhat schematic cross-sectional views illustrating a method of manufacturing an STT-MRAM magnetic device 500 including the MTJ structure 70 of FIG. 4, according to an embodiment of the inventive concepts. In FIGS. 8A to 8K, the reference numerals that are the same as in FIG. 4 denote the same elements and thus will not be redundantly described herein.

Figure 8A:
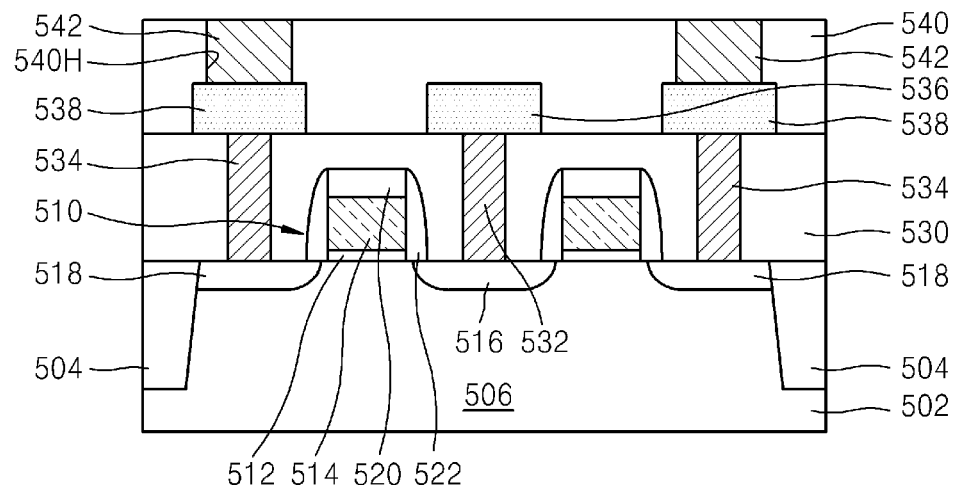
FIGS. 8A to 8K are somewhat schematic cross-sectional views illustrating a method of manufacturing a magnetic device according to an embodiment of the inventive concepts.

Referring to FIG. 8A, an isolation film 504 can be formed on a substrate 502 to define an active area 506, and a transistor 510 can be formed on the active area 506.

In some embodiments, the substrate 502 can be a semiconductor wafer. The substrate 502 may include silicon (Si). In some embodiments, the substrate 502 may include a semiconductor element such as germanium (Ge), or a compound semiconductor such as SiC, GaAs, InAs, and InP. In some embodiments, the substrate 502 may have a silicon-on-insulator (SOI) structure. For example, the substrate 502 may include a buried oxide (BOX) layer. In some embodiments, the substrate 502 may include a conductive region, e.g., a well doped with impurities or a structure doped with impurities. The isolation film 504 may have a shallow trench isolation (STI) structure.

The transistor 510 can include a gate insulating film 512, a gate electrode 514, a source region 516, and a drain region 518. The gate electrode 514 can be formed such that an upper surface and both side walls thereof are insulated by an insulating capping pattern 520 and insulating spacers 522.

Then, a planarized first interlayer insulating film 530 covering the transistor 510 can be formed on the substrate 502, first contact plugs 532 can be formed through the first interlayer insulating film 530 to be electrically connected to the source region 516, and second contact plugs 534 can be formed through the first interlayer insulating film 530 to be electrically connected to the drain region 518. After a conductive layer is formed on the first interlayer insulating film 530, the conductive layer can then be patterned to form a source line 536 that is electrically connected to the source region 516 via the first contact plugs 532 and conductive patterns 538 that are electrically connected to the drain region 518 at both sides of the source line 536 via the second contact plugs 534.

Then, a second interlayer insulating film 540 can be formed on the first interlayer insulating film 530 to cover the source line 536 and the conductive patterns 538. Using a photolithographic process, lower electrode contact holes 540H can be formed by partially removing the second interlayer insulating film 540 to expose top surfaces of the conductive patterns 538. Lower electrode contact plugs 542 can be formed by filling the insides of the lower electrode contact holes 540H with a conductive material and then polishing the conductive material to expose a top surface of the second interlayer insulating film 540. In some embodiments, the lower electrode contact plugs 542 can each include at least one material selected from the group consisting of TiN, Ti, TaN, Ta, and W.

Figure 8B:
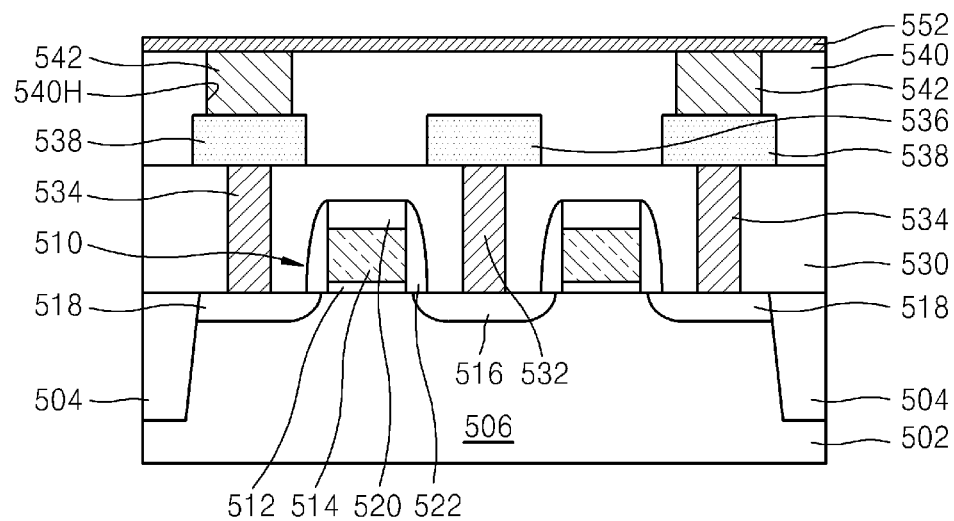

Referring to FIG. 8B, a lower electrode layer 552 can be formed on the second interlayer insulating film 540 and the lower electrode contact plugs 542. In some embodiments, the lower electrode layer 552 can be formed of a metal or a metal nitride. For example, the lower electrode layer 552 may be formed of TiN. To form the lower electrode 552, CVD, physical vapor deposition (PVD), atomic layer deposition (ALD), or reactive pulsed laser deposition (PLD) may be used. The lower electrode layer 552 can be substantially the same as the electrode 110 described previously with reference to FIG. 5.

Figure 8C:
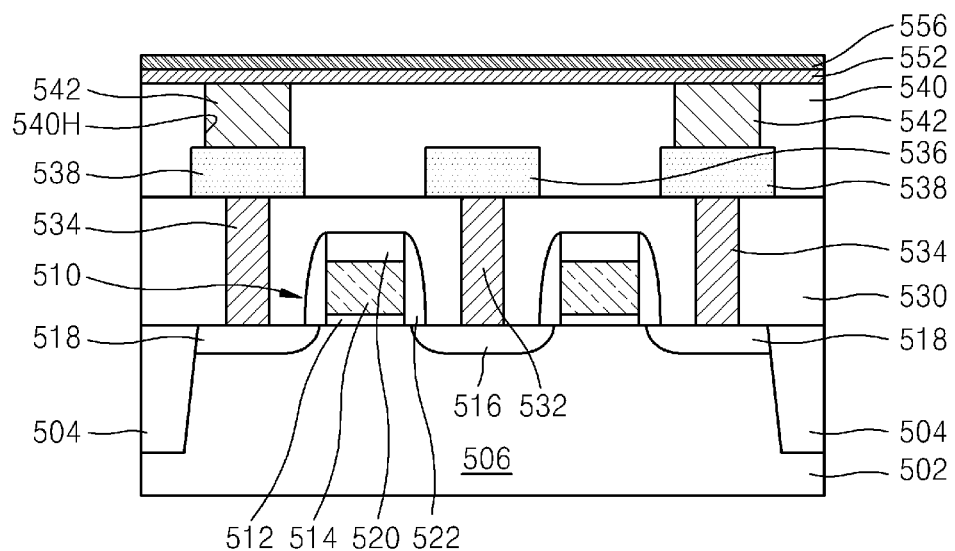

Referring to FIG. 8C, a seed layer 556 can be formed on the lower electrode layer 552. The seed layer 556 may include a Ru layer, a Pt layer, or a Pd layer. The seed layer 556 may be formed by CVD, PVD, ALD, or reactive PLD. In some embodiments, the seed layer 556 may be formed according to a DC magnetron sputtering process using krypton (Kr) as a sputtering gas.

Figure 8D:
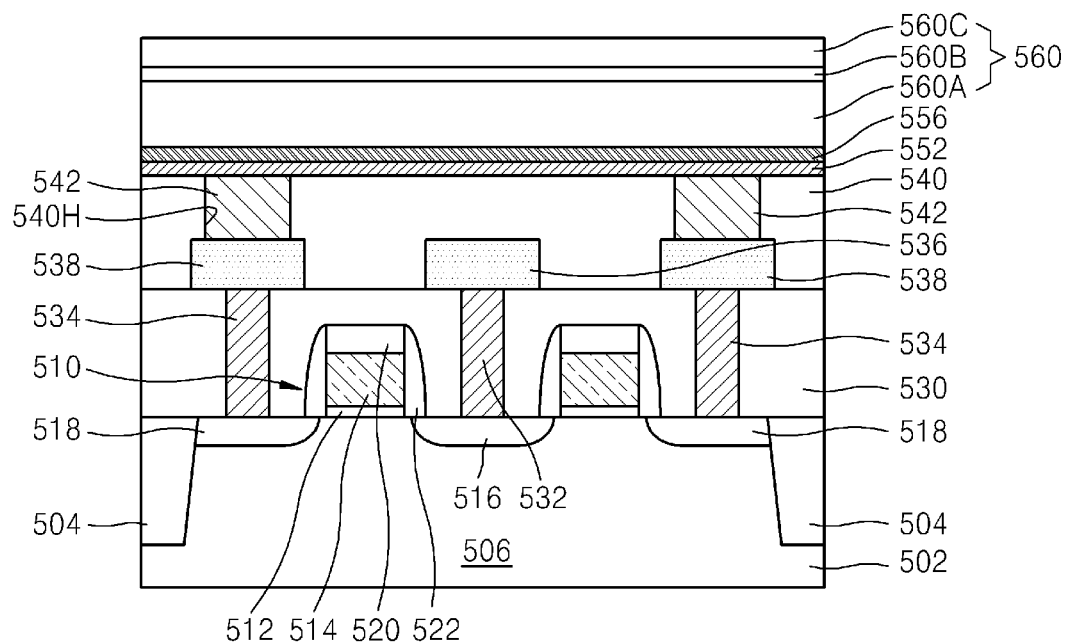

Referring to FIG. 8D, a hybrid magnetization layer 560 can be formed by sequentially forming a first PMA layer 560A, a blocking layer 560B, and a second PMA layer 560C on the seed layer 556. The hybrid magnetization layer 560 may constitute a free layer.

The hybrid magnetization layer 560 including the first PMA layer 560A, the blocking layer 560B, and the second PMA layer 560C can be substantially the same as the hybrid magnetization layer 50 described above with reference to FIG. 2.

The first PMA layer 560A, the blocking layer 560B, and the second PMA layer 560C may each be formed by MBE or MOCVD. The first PMA layer 560A, the blocking layer 560B, and the second PMA layer 560C may each be formed at a relatively low process temperature such as about 200 to 400° C.

Figure 8E:
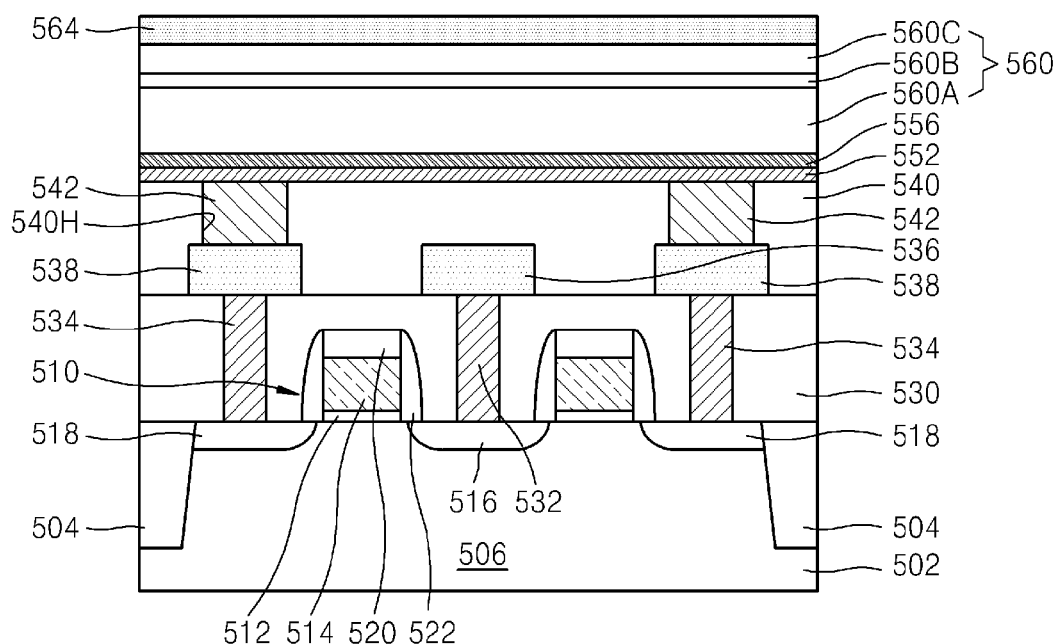

Referring to FIG. 8E, a tunnel bather 564 can be formed on the hybrid magnetization layer 560. The tunnel bather 564 may include an oxide formed of a material selected from the group including Mg, Ti, Al, MgZn, and MgB, a Ti nitride, a V nitride, and a combination of the Ti nitride and the V nitride.

Although not shown, the method of manufacturing the magnetic device 500 may further include forming a polarization-enhancement layer on the hybrid magnetization layer 560 before the tunnel barrier 564 is formed. The polarization-enhancement layer may include a CoFeB magnetic layer. The polarization-enhancement layer may have a thickness of about 10 to 20 Å.

Figure 8F:
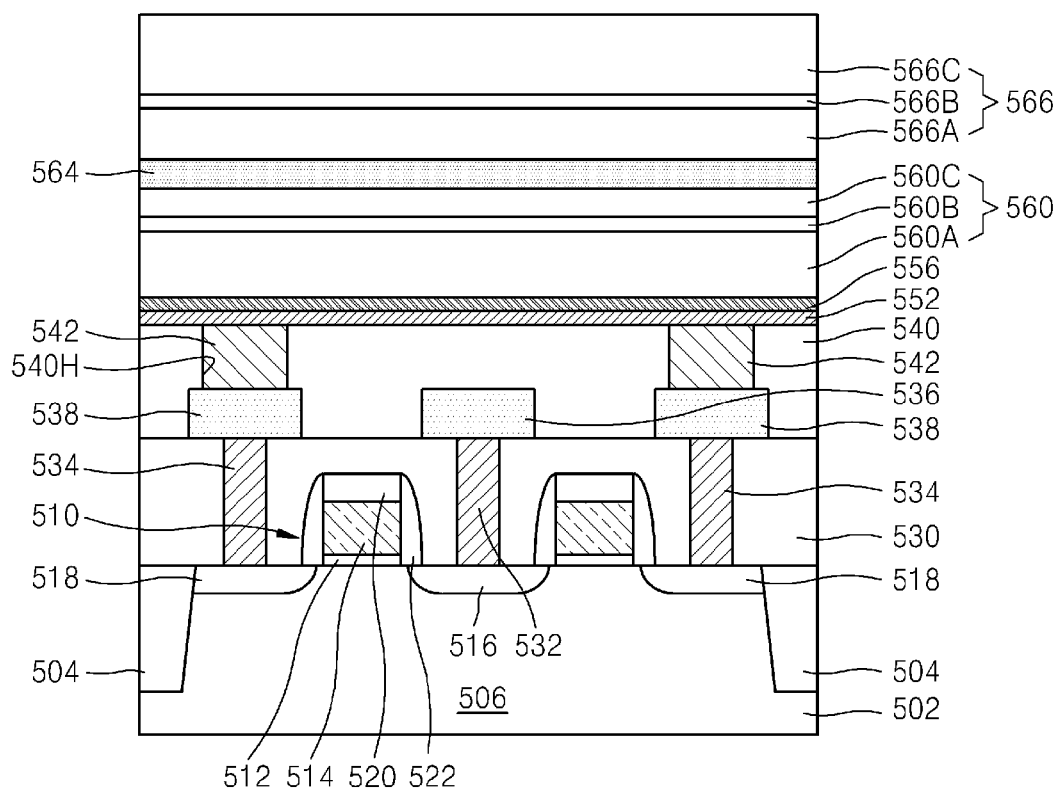

Referring to FIG. 8F, a pinned layer 566 having an SAF structure can be formed by sequentially forming a first pinned layer 566A, an exchange coupling film 566B, and a second pinned layer 566C on the tunnel barrier 564.

The pinned layer 566 (including the first pinned layer 566A, the exchange coupling film 566B, and the second pinned layer 566C) can be substantially the same as the upper pinned layer 180 (including the first upper pinned layer 182, the exchange coupling film 186, and the second upper pinned layer 184) as described above with reference to FIG. 5.

Figure 8G:
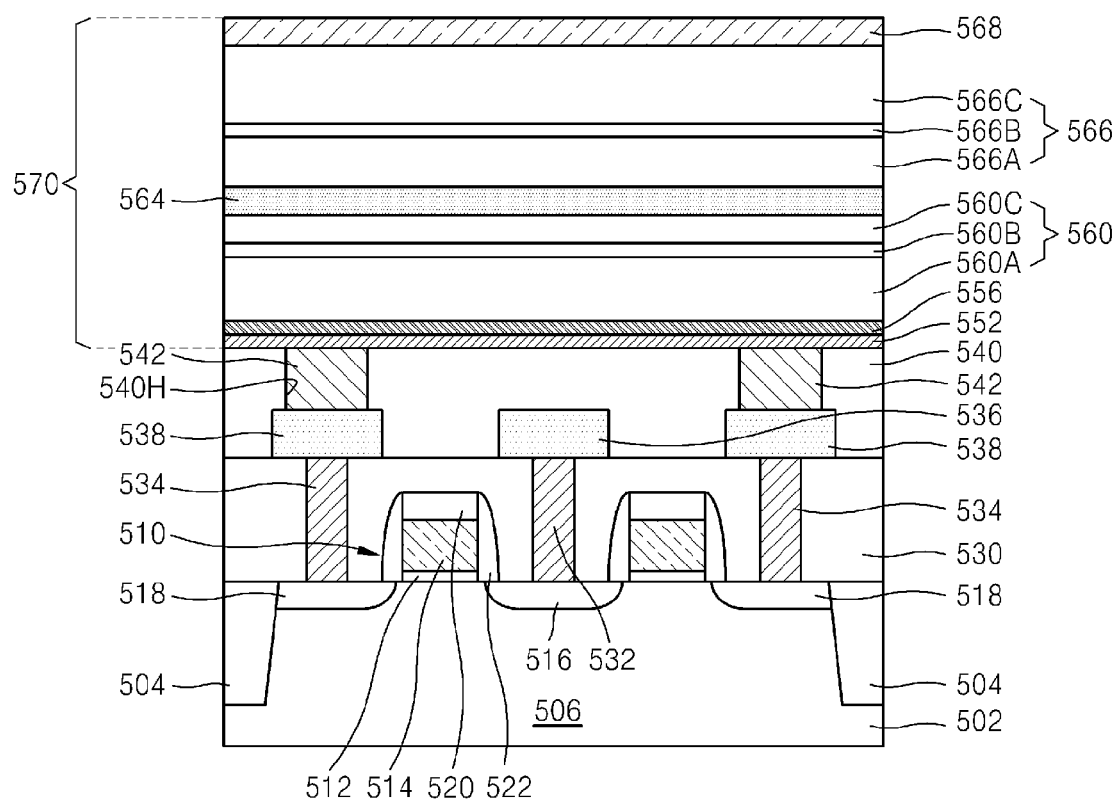

Referring to FIG. 8G, a capping layer 568 can be formed on the upper pinned layer 566. The capping layer 568 may include at least one material selected from the group including Ta, Al, Cu, Au, Ti, TaN, and TiN. In some embodiments, the capping layer 568 is optional.

A stacked structure 570, in which the layers 552 to 568 are sequentially stacked, is not limited to that illustrated in FIG. 8G and may be modified without departing from the scope of the inventive concepts. For example, the magnetic device 500 may be formed to include the stacked structure of one of the magnetic devices 100, 200, or 300, as illustrated in FIGS. 5 to 7, instead of the stacked structure 570. According to embodiments of the inventive concepts, various types of films may be added or replaced in the stacked structure 570 based on the desired characteristics of a magnetic device.

Figure 8H:
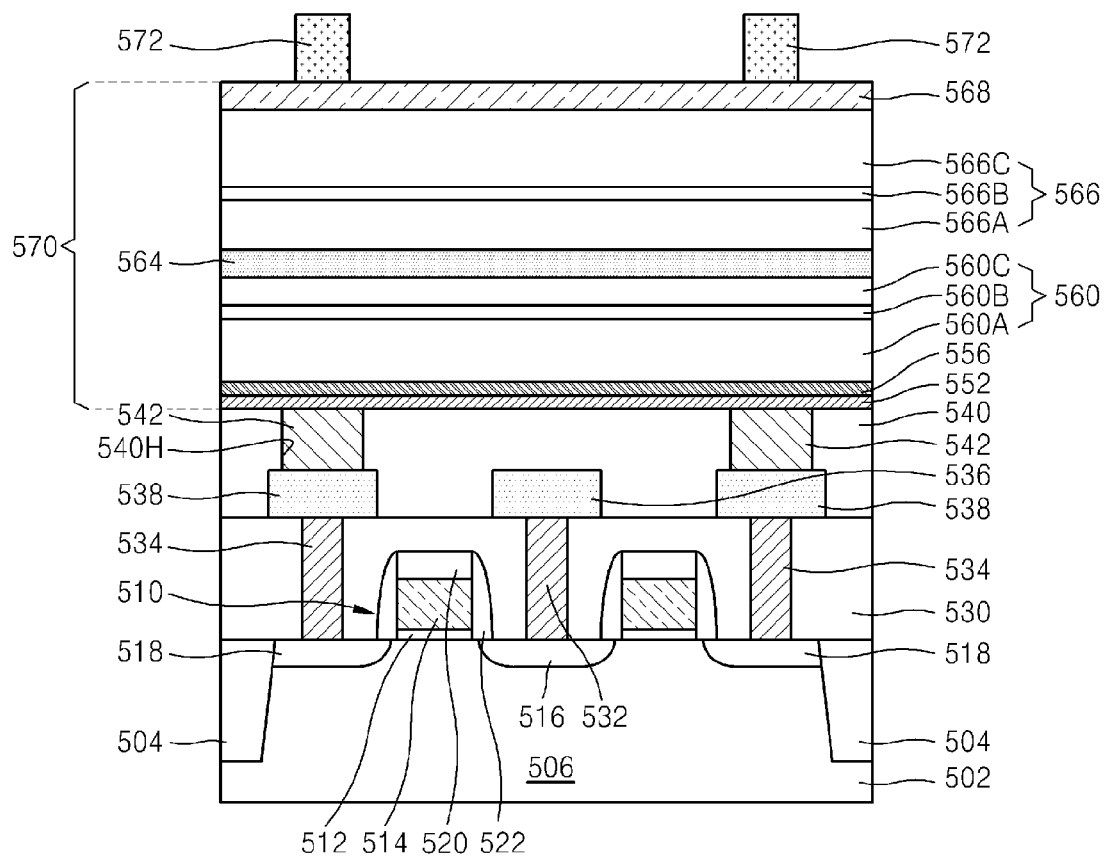

Referring to FIG. 8H, a plurality of conductive mask patterns 572 can be formed on the stacked structure 570. The plurality of conductive mask patterns 572 may be each formed of a metal or a metal nitride. In some embodiments, the plurality of conductive mask patterns 572 may each include at least one material selected from the group including Ru, W, TiN, TaN, Ti, Ta, and a metallic glass alloy. For example, the conductive mask patterns 572 may each have a two-layer structure including Ru/TiN or TiN/W. The conductive mask patterns 572 may be formed on the same axis as the lower electrode contact plugs 542.

Figure 8I:
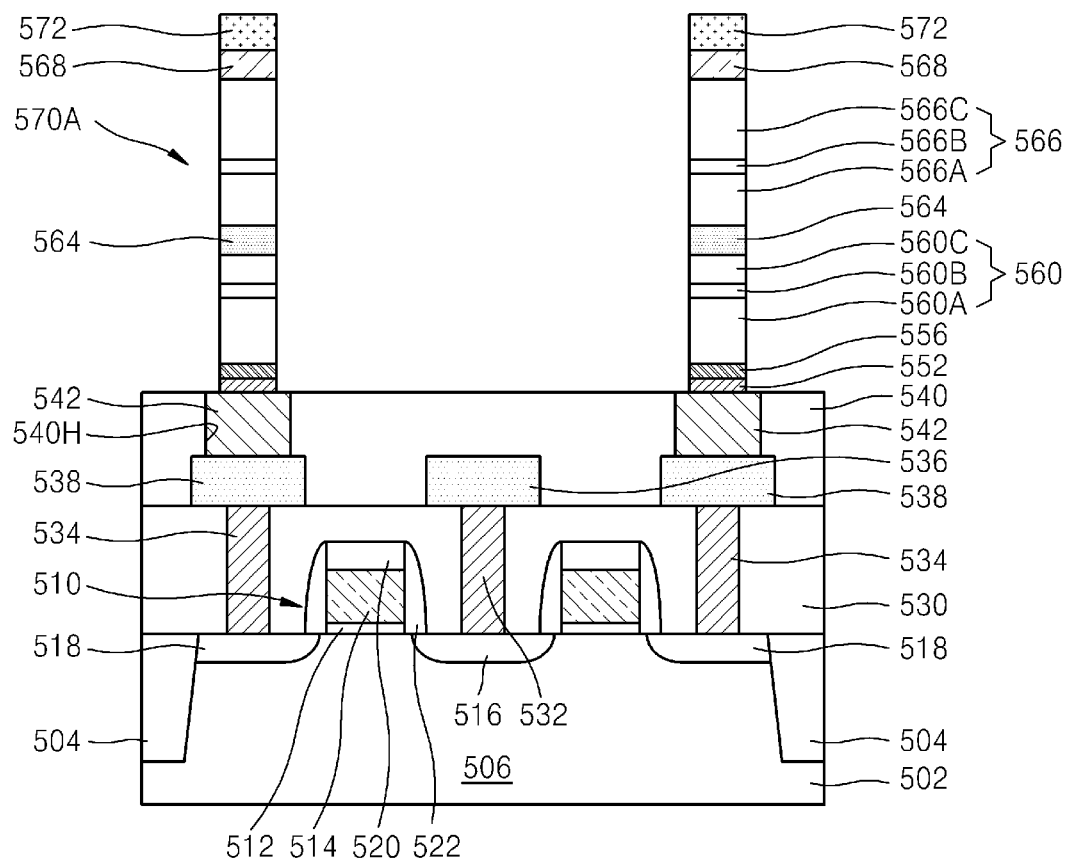

Referring additionally to FIG. 8I, the stacked structure 570 can be etched using the plurality of conductive mask patterns 572 as an etch mask to form a plurality of magnetic resistance devices 570A.

In some embodiments, in order to etch the stacked structure 570, a structure including the plurality of conductive mask patterns 572 may be loaded into a plasma etch chamber and a plasma etching process may then be performed. In some embodiments, the stacked structure 570 may be etched by reactive ion etching (RIE), ion beam etching (IBE), or Ar milling. In some embodiments, a first etch gas including at least one of $SF_6$, $NF_3$, $SiF_4$, $CF_4$, $Cl_2$, $CH_3OH$, $CH_4$, $CO$, $NH_3$, $H_2$, $N_2$, and $HBr$ may be used to etch the stacked structure 570. In some embodiments, in order to etch the stacked structure 570, not only the first etch gas but also at least one additional gas selected from the group including Ne, Ar, Kr, and Xe may be used.

The stacked structure 570 may be etched using plasma formed of an inductively-coupled plasma (ICP) source, a capacitively-coupled plasma (CCP) source, an electron cyclotron resonance (ECR) plasma source, a helicon-wave excited plasma (ECR) source, or an adaptively-coupled plasma (ACP) source.

The etching of the stacked structure 570 may further include performing etching using a second etch gas, the composition ratio of which is different from that of the first etch gas. The second etch gas may include at least one gas selected from the group including $SF_6$, $NF_3$, $SiF_4$, $CF_4$, $Cl_2$, $CH_3OH$, $CH_4$, CO, $NH_3$, $H_2$, $N_2$, and HBr. In some embodiments, during the etching using the second etch gas, at least one second additional gas selected from the group including Ne, Ar, Kr, and Xe may further be used.

The etching of the stacked structure 570 may be performed at about −10 to 65° C. under about 2 to 5 mT. During the etching of the stacked structure 570, portions of top surfaces of the plurality of conductive mask patterns 572 may be exhausted in an etch atmosphere, thereby reducing the thicknesses of the plurality of conductive mask patterns 572.

Although not shown, the second interlayer insulating film 540, exposed after the stacked structure 570 is etched, may be etched by a predetermined thickness starting from the top surface thereof.

The plurality of magnetic resistance devices 570A obtained by etching the stacked structure 570 are present on the plurality of lower electrode contact plugs 542. In the plurality of magnetic resistance devices 570A, remaining portions of the plurality of conductive mask patterns 572 and the capping layer 568 may function as an upper electrode.

Figure 8J:
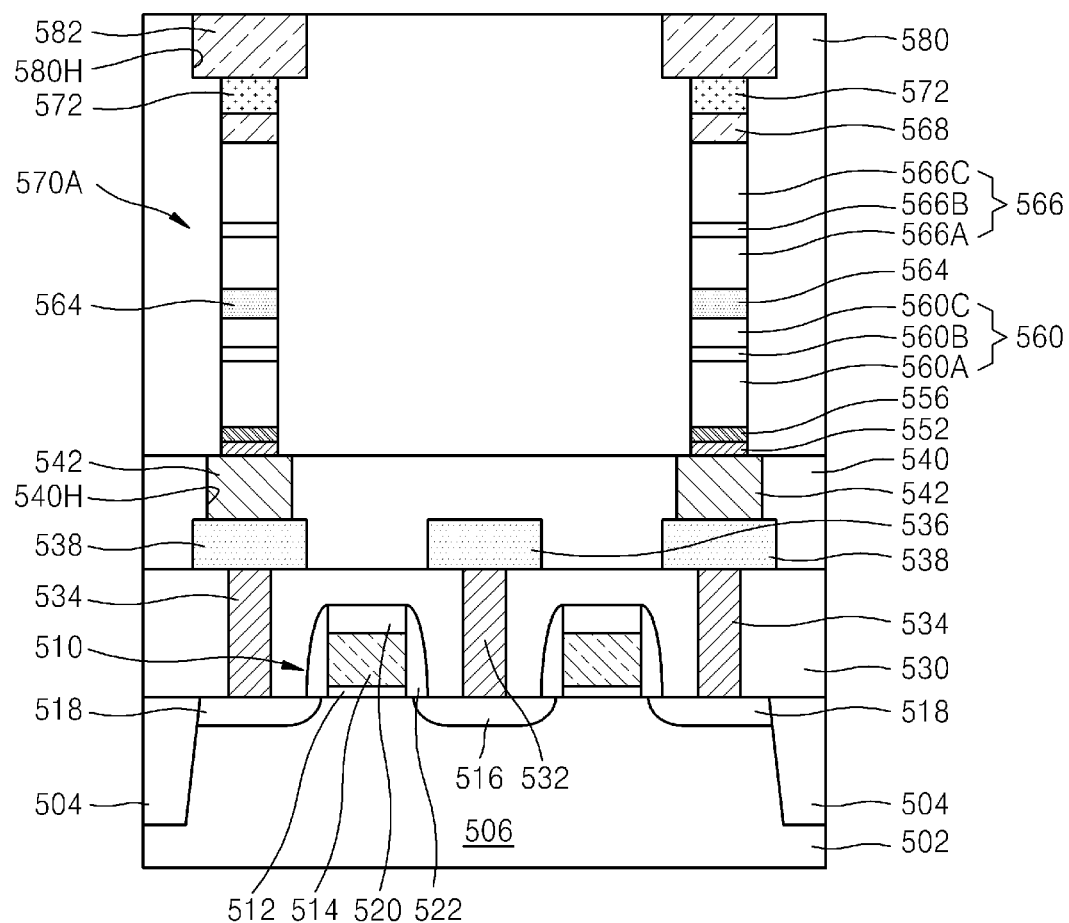

Referring to FIG. 8J, a planarized third interlayer insulating film 580 can be formed to cover the plurality of magnetic resistance devices 570A, and portions of the third interlayer insulating film 580 can be removed by etching to expose top surfaces of the conductive mask patterns 572 that constitute the plurality of magnetic resistance devices 570A, thereby forming a plurality of bit line contact holes 580H. Then, a conductive layer can be formed to fill the insides of the plurality of bit line contact holes 580H. The conductive layer can then be abraded or etch-backed until a top surface of the third interlayer insulating film 580 is exposed, thereby forming a plurality of bit line contact plugs 582 in the plurality of bit line contact holes 580H.

Figure 8K:
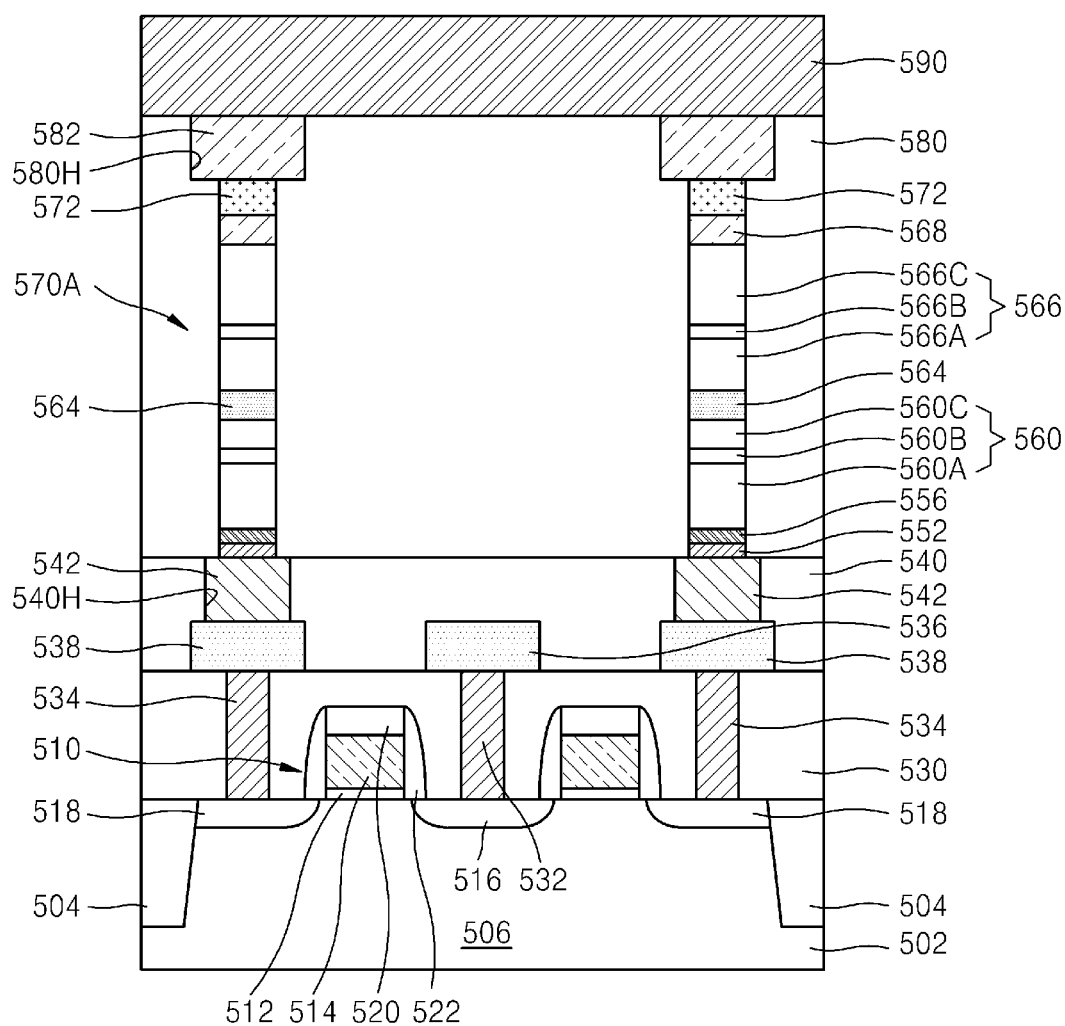

Referring to FIG. 8K, a conductive layer for forming bit lines can be formed on the third interlayer insulating film 580 and the plurality of bit line contact plugs 582. The conductive layer can then be patterned to form a line-type bit line 590 to be electrically connected to the plurality of bit line contact plugs 582, thereby completing the magnetic device 500.

Figure 9:
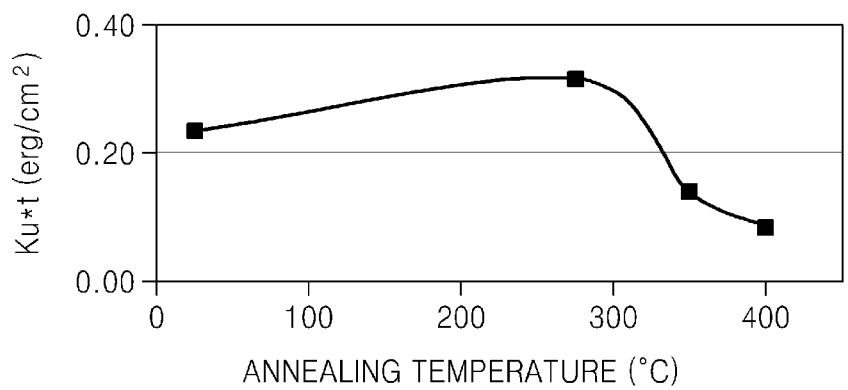
FIG. 9 is a graph illustrating the effect of various annealing temperatures on the PMA (Ku*t) of a magnetic device, according to an embodiment of the inventive concepts.

FIG. 9 is a graph illustrating the PMA (Ku*t) of a magnetic device at different annealing temperatures according to an embodiment of the inventive concepts. Referring to FIG. 9, for the evaluation, a Ru seed layer was formed on a TiN electrode to a thickness of 30 Å, and a hybrid magnetization layer, such as the hybrid magnetization layer 50 described above with reference to FIG. 2, was formed on the Ru seed layer. More specifically, in order to form the hybrid magnetization layer, a free layer including a first PMA layer formed of a [Co(2)/Pt(2)]×4 ultra-lattice layer having a Ni-doped $L1_1$ structure (where the number in the parentheses denotes a layer thickness expressed in the units of Å), a blocking layer formed of a Ta film having a thickness of 4 Å, and a second PMA layer formed of a CoFeB film having a thickness of 7.5 Å was formed. During the forming of the first PMA layer, a Ni dopant was substituted for a Co site. To accomplish this, both Co and Ni were supplied when a Co film was formed, and Ni was not supplied when a Pt film was formed. In the first PMA layer, the Ni dopant was doped at about 25 at %.

Then, a resultant structure including the hybrid magnetization layer was annealed at various temperatures for about two hours, and the PMA (Ku*t) in the hybrid magnetization layer was evaluated. The evaluation, as illustrated in the graph of FIG. 9, revealed that the PMA was maintained in the hybrid magnetization layer when the hybrid magnetization layer was annealed at about 400° C. or less. The intensity of the PMA (Ku*t) may be controlled to a desired level by adjusting a composition ratio of the $L1_1$ structure, the number of times of layering the [Co(2)/Pt(2)] ultra-lattice layer, etc.

Figure 10:
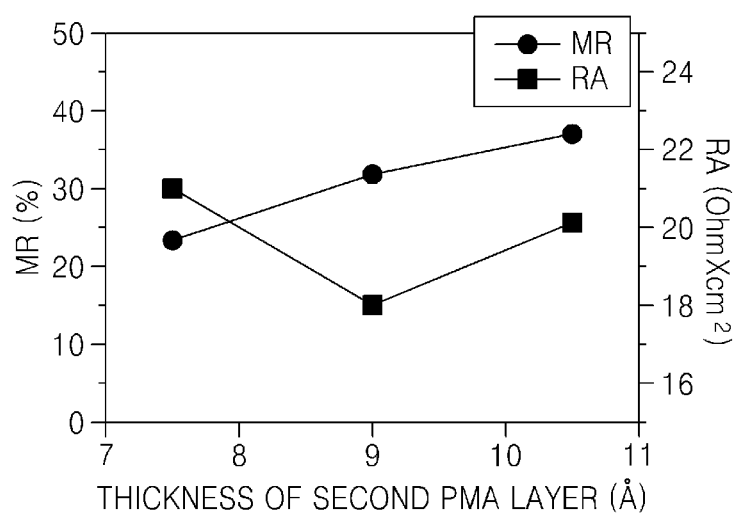
FIG. 10 is a graph comparing a magneto-resistance (MR) ratio and a resistance-area (RA) product of a perpendicular magnetization tunneling magneto-resistance (TMR) device with respect to various thicknesses of a second PMA layer, according to an embodiment of the inventive concepts.

FIG. 10 is a graph illustrating results of evaluating an MR ratio and a resistance-area (RA) product of a perpendicular magnetization TMR device according to various thicknesses of a second PMA layer, according to further aspects of the inventive concepts.

Referring to FIG. 10, for the evaluation, three samples having the same structure as that used in the evaluation of FIG. 9 were manufactured. However, second PMA layers included in respective hybrid magnetization layers in the three samples were formed to thicknesses of 7.5 Å, 9 Å, and 10.5 Å, respectively, and were then annealed at about 300° C. for about two hours.

The evaluation, as illustrated in the graph of FIG. 10, revealed that when the second PMA layer had a thickness of 7.5 Å, the MR ratio was about 30% and the RA product was relatively low.

Figure 11:
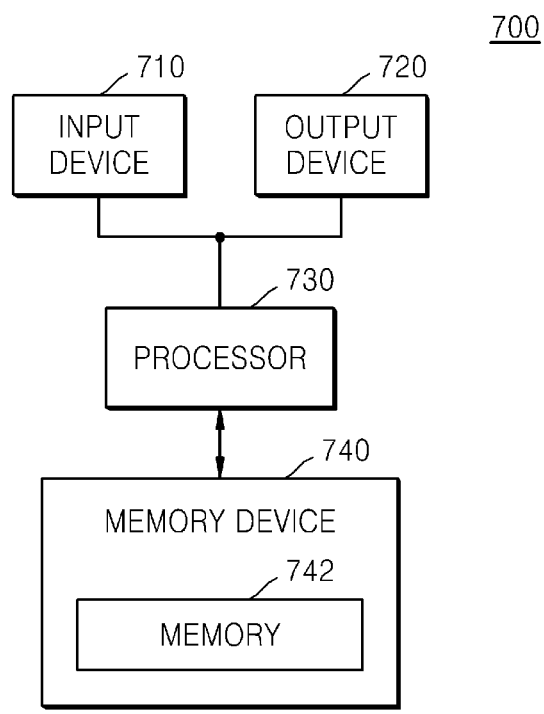
FIG. 11 is a schematic block diagram of an electronic system including a magnetic device constructed according to an embodiment of the inventive concepts.

FIG. 11 is a block diagram of an electronic system 700 including a magnetic device according to another embodiment of the inventive concepts.

Referring to FIG. 11, the electronic system 700 can include an input device 710, an output device 720, a processor 730, and a memory device 740. In some embodiments, the memory device 740 may include a cell array including non-volatile memory cells, and a peripheral circuit configured to perform a read/write operation, etc. In some embodiments, the memory device 740 may include a non-volatile memory device and a memory controller.

A memory 742 included in the memory device 740 may include at least one of the magnetic devices 10, 100, 200, 300, and 500 including the hybrid magnetization layer 50, and the MTJ structures 30 and 70 including the hybrid magnetization layer 50 according to various embodiments of the inventive concepts described above with reference to FIGS. 1 to 10.

The processor 730 may be connected to the input device 710, the output device 720, and the memory device 740 via an interface to control overall operations of the electronic system 700.

Figure 12:
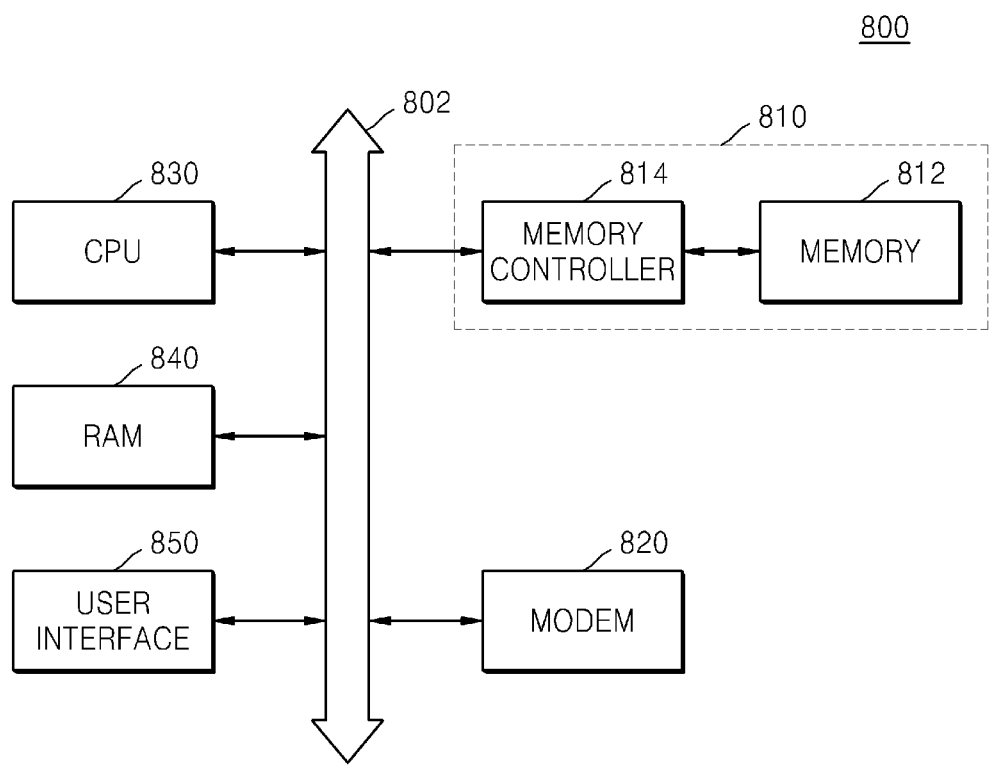
FIG. 12 is a schematic block diagram of an information processing system including a magnetic device constructed according to an embodiment of the inventive concepts.

FIG. 12 is a block diagram of an information processing system 800 including a magnetic device according to an embodiment of the inventive concepts.

Referring to FIG. 12, the information processing system 800 can include a non-volatile memory system 810, a modem 820 or other communications device, a central processing unit (CPU) 830, a random access memory (RAM) 840, and a user interface 850 that are electrically connected via a bus 802.

The non-volatile memory system 810 may include a memory 812 and a memory controller 814. The non-volatile memory system 810 stores data processed by the CPU 830 or data input from the outside.

The non-volatile memory system 810 may include a non-volatile memory such as MRAM, phase-change RAM (PRAM), resistive RAM (RRAM), ferroelectric RAM (FRAM), etc. At least one of the memory 812 and the RAM 840 may include at least one of the magnetic devices 10, 100, 200, 300, and 500 having the hybrid magnetization layer 50 and the MTJ structures 30 and 70 having the hybrid magnetization layer 50 according to various embodiments of the inventive concepts described above with reference to FIGS. 1 to 10.

The information processing system 800 may be used in portable computers, web tablets, wireless phones, mobile phones, digital music players, memory cards, MP3 players, navigation systems, portable multimedia players (PMPs), solid-state disks (SSDs), or household appliances.

Figure 13:
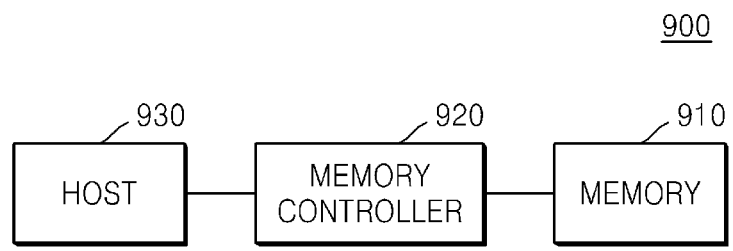
FIG. 13 is a schematic block diagram of a memory card including a magnetic device constructed according to an embodiment of the inventive concepts.

FIG. 13 is a block diagram of a memory card 900 including a magnetic device according to an embodiment of the inventive concepts.

The memory card 900 can include a memory 910 and a memory controller 920. The memory 910 may store data. In some embodiments, the memory 910 has non-volatile characteristics capable of retaining data stored therein even if a power failure occurs. The memory 910 may include at least one of the magnetic devices 10, 100, 200, 300, and 500 including the hybrid magnetization layer 50 and the MTJ structures 30 and 70 including the hybrid magnetization layer 50 according to various embodiments of the inventive concepts described above with reference to FIGS. 1 to 10. The memory controller 920 may read data stored in the memory 910 or store data in the memory 910, in response to a read/write request from a host 930.

While the inventive concepts have been particularly shown and described with reference to exemplary embodiments thereof, it will be understood that various changes in form and details may be made therein without departing from the spirit and scope of the following claims.

What is claimed is:

1. A magnetic device comprising:
   a tunnel barrier; and
   a hybrid magnetization layer disposed adjacent the tunnel barrier,
   wherein the hybrid magnetization layer comprises:
      a first perpendicular magnetic anisotropy (PMA) layer comprising:
         a multi-layer film in which a first layer formed of Co and a second layer formed of Pt or Pd are alternately stacked; and
         a first dopant comprising an element different from elements of the first and second layers;
      a second PMA layer disposed between the first PMA layer and the tunnel barrier, said second PMA layer comprising at least one element selected from the group consisting of Co, Fe, and Ni; and
      an amorphous blocking layer disposed between the first PMA layer and the second PMA layer.

2. The magnetic device of claim 1, wherein the first PMA layer comprises at least one of:
   a first stacked structure expressed as [CoX/Pt]×m; and
   a second stacked structure expressed as [Co/PtX]×n,
   wherein X denotes the first dopant,
   wherein m denotes a number of stacked [CoX/Pt] structures, and wherein 2≤m≤20, and
   wherein n denotes a number of stacked [Co/PtX] structures, and wherein 2≤n≤20.

3. The magnetic device of claim 1, wherein the first PMA layer comprises at least one of:
   a first stacked structure expressed as [CoX/Pd]×m; and
   a second stacked structure expressed as [Co/PdX]×n,
   wherein X denotes the first dopant,
   wherein m denotes a number of stacked [CoX/Pd] structures, and wherein 2≤m≤20, and
   wherein n denotes a number of stacked [Co/PdX] structures, and wherein 2≤n≤20.

4. The magnetic device of claim 1, wherein the first dopant comprises at least one element selected from the group consisting of Ni, Fe, V, Cr, and Si.

5. The magnetic device of claim 1, wherein the second PMA layer comprises a material expressed as $Co_aFe_bB_cZ_{(1-a-b-c)}$,
   wherein Z denotes a second dopant,
   wherein a, b, and c each denote an atomic ratio,
   wherein 0≤a≤0.9, 0≤b≤0.9, and 0≤c≤0.4, and
   wherein a, b, and c are not all 0.

6. The magnetic device of claim 5, wherein the second dopant comprises at least one element selected from the group consisting of Si, Cr, Al, Ta, Hf, Zr, Ni, V, Mo, P, C, W, Nb, Mn, and Ge.

7. The magnetic device of claim 1, wherein the first PMA layer and the second PMA layer have different crystal-oriented structures.

8. The magnetic device of claim 1, wherein the first PMA layer comprises a hexagonal closest packing (HCP) (001) crystal-oriented structure, and
   wherein the second PMA layer comprises a body-centered cubic (BCC) (001) crystal-oriented structure.

9. The magnetic device of claim 1, wherein the first PMA layer comprises a magnetic material having an $L1_1$ type or $L1_0$ type atomic ordering structure.

10. The magnetic device of claim 1, wherein the blocking layer comprises at least one material selected from the group consisting of metals, alloys, metal oxides, metal nitrides, and metal oxynitrides.

11. A magnetic device comprising:
    a free layer including a first magnetization layer;
    a pinned layer including a second magnetization layer; and
    a tunnel barrier disposed between the free layer and the pinned layer,
    wherein at least one of the first magnetization layer and the second magnetization layer comprises a hybrid magnetization layer, the said hybrid magnetization layer comprising:
       a first perpendicular magnetic anisotropy (PMA) layer including a multi-layer film having alternately stacked first layers formed of Co and second layers formed of Pt or Pd, and a first dopant formed of an element that is different from elements of the first and second layers, wherein the first PMA layer has an axis of easy magnetization arranged in a direction perpendicular to a direction in which the first PMA layer extends, and wherein the first PMA layer comprises a magnetic material having a Co-based $L1_1$ type or $L1_0$ type atomic ordering structure, and wherein the first dopant comprises one element selected from group consisting of Ni, Fe, V, Cr, and Si; and
       a second PMA layer disposed between the first PMA layer and the tunnel barrier, and including at least one element selected from the group consisting of Co, Fe, and Ni.

12. The magnetic device of claim 11, wherein the second PMA layer has an axis of easy magnetization arranged in a direction perpendicular to a direction in which the second PMA layer extends, and wherein the second PMA layer comprises a single-layer film or a multi-layer film formed of a material expressed as $Co_aFe_bB_cZ_{(1-a-b-c)}$, wherein Z denotes a second dopant, wherein a, b, and c each denote an atomic ratio, wherein $0 \le a \le 0.9$, $0 \le b \le 0.9$, and $0 \le c \le 0.4$, and wherein a, b, and c are not all '0', and wherein the second dopant comprises an element selected from the group consisting of Si, Cr, Al, Ta, Hf, Zr, Ni, V, Mo, P, C, W, Nb, Mn, and Ge.

13. The magnetic device of claim 11, wherein the hybrid magnetization layer further comprises an amorphous blocking layer disposed between the first PMA layer and the second PMA layer.

14. The magnetic device of claim 11, wherein the first magnetization layer comprises the hybrid magnetization layer, and wherein the second magnetization layer has a synthetic anti-ferromagnetic coupling (SAF) structure.

15. A hybrid magnetization layer in a magnetic device comprising:

a first perpendicular magnetic anisotropy (PMA) layer comprising:

a multi-layer film in which a first layer formed of Co and a second layer formed of Pt or Pd are alternately stacked; and a first dopant comprising an element different from elements of the first and second layers;

a second PMA layer comprising at least one element selected from the group consisting of Co, Fe, and Ni; and an amorphous blocking layer disposed between the first PMA layer and the second PMA layer.

16. The hybrid magnetization layer of claim 15, wherein the first PMA layer has an axis of easy magnetization arranged in a direction perpendicular to a direction in which the first PMA layer extends, and wherein the first PMA layer comprises a magnetic material having a Co-based $L1_1$ type or $L1_0$ type atomic ordering structure, and wherein the first dopant comprises one element selected from group consisting of Ni, Fe, V, Cr, and Si.

17. The hybrid magnetization layer of claim 15, wherein the second PMA layer has an axis of easy magnetization arranged in a direction perpendicular to a direction in which the second PMA layer extends, and wherein the second PMA layer comprises a single-layer film or a multi-layer film comprising a material expressed as $Co_aFe_bB_cZ_{(1-a-b-c)}$, wherein Z denotes a second dopant, wherein a, b, and c each denote an atomic ratio, wherein $0 \le a \le 0.9$, $0 \le b \le 0.9$, and $0 \le c \le 0.4$, and wherein a, b, and c are not all '0', and wherein the second dopant comprises an element selected from the group consisting of Si, Cr, Al, Ta, Hf, Zr, Ni, V, Mo, P, C, W, Nb, Mn, and Ge.

18. The hybrid magnetization layer of claim 15, wherein the second PMA layer further comprises a non-magnetic material layer.

19. The hybrid magnetization layer of claim 15, wherein the hybrid magnetization layer provides a free layer of the magnetic device.

* * * * *